US010675870B1

(12) United States Patent
Tanaka et al.

(10) Patent No.: US 10,675,870 B1
(45) Date of Patent: Jun. 9, 2020

(54) LIQUID EJECTION APPARATUS AND METHOD FOR MANUFACTURING LIQUID EJECTION APPARATUS

(71) Applicant: BROTHER KOGYO KABUSHIKI KAISHA, Nagoya-shi, Aichi-ken (JP)

(72) Inventors: Taiki Tanaka, Nagoya (JP); Takashi Yoshikawa, Kasugai (JP)

(73) Assignee: BROTHER KOGYO KABUSHIKI KAISHA, Nagoya-Shi, Aichi-Ken (JP)

(*) Notice: Subject to any disclaimer, the term of this patent is extended or adjusted under 35 U.S.C. 154(b) by 0 days.

(21) Appl. No.: 16/750,785

(22) Filed: Jan. 23, 2020

Related U.S. Application Data

(63) Continuation of application No. 16/443,080, filed on Jun. 17, 2019, now Pat. No. 10,583,654, which is a
(Continued)

(30) Foreign Application Priority Data

Sep. 30, 2015 (JP) .................. 2015-192764

(51) Int. Cl.
*B41J 2/045* (2006.01)
*B41J 2/14* (2006.01)
(Continued)

(52) U.S. Cl.
CPC ....... *B41J 2/14201* (2013.01); *B41J 2/14233* (2013.01); *B41J 2/164* (2013.01);
(Continued)

(58) Field of Classification Search
CPC .............. B41J 2/14201; B41J 2/14274; B41J 2/14233; B41J 2/1433
See application file for complete search history.

(56) References Cited

U.S. PATENT DOCUMENTS

2001/0001458 A1  5/2001  Hashizume et al.
2002/0071008 A1  6/2002  Hashizume et al.
(Continued)

FOREIGN PATENT DOCUMENTS

JP   H09-286104 A   11/1997
JP   2014-184603 A  10/2014

OTHER PUBLICATIONS

Notice of Allowance dated Apr. 14, 2017 received in related U.S. Appl. No. 15/259,721.
(Continued)

*Primary Examiner* — Juanita D Jackson
(74) *Attorney, Agent, or Firm* — Scully Scott Murphy and Presser

(57) ABSTRACT

A liquid ejection apparatus is disclosed. One apparatus includes a piezoelectric element. The piezoelectric element includes an upper electrode and a lower electrode. The lower electrode has a partial overlapping portion and a non-overlapping portion. The partial overlapping portion at least partially overlaps the pressure chamber. The partial overlapping portion of the lower electrode has two ends in the transverse direction. The upper electrode has two ends in the transverse direction. A distance from the center of the pressure chamber in the transverse direction to one of the two ends of the upper electrode in the transverse direction is smaller than a distance from the center of the pressure chamber in the transverse direction to a corresponding one of the two ends of the partial overlapping portion in the transverse direction.

8 Claims, 14 Drawing Sheets

Related U.S. Application Data continuation of application No. 15/995,396, filed on Jun. 1, 2018, now Pat. No. 10,363,741, which is a continuation of application No. 15/673,720, filed on Aug. 10, 2017, now Pat. No. 10,011,110, which is a continuation of application No. 15/259,721, filed on Sep. 8, 2016, now Pat. No. 9,731,506.

(51) Int. Cl.
    *H01L 41/29*     (2013.01)
    *H01L 41/047*     (2006.01)
    *B41J 2/16*     (2006.01)
    *H01L 41/09*     (2006.01)

(52) U.S. Cl.
    CPC .......... *B41J 2/1607* (2013.01); *H01L 41/047* (2013.01); *H01L 41/0475* (2013.01); *H01L 41/0477* (2013.01); *H01L 41/0973* (2013.01); *H01L 41/29* (2013.01); *B41J 2002/14491* (2013.01)

(56) References Cited

U.S. PATENT DOCUMENTS

| | | |
|---|---|---|
| 2004/0085409 A1 | 5/2004 | Hashizume et al. |
| 2007/0013748 A1 | 1/2007 | Hashizume et al. |
| 2007/0103517 A1 | 5/2007 | Hashizume et al. |
| 2008/0001502 A1 | 1/2008 | Hashizume et al. |
| 2008/0100676 A1 | 5/2008 | Sakaida |
| 2009/0085435 A1* | 4/2009 | Sekiguchi ............ B41J 2/14233 310/317 |
| 2009/0244212 A1 | 10/2009 | Shimada |
| 2013/0194353 A1 | 8/2013 | Hirai et al. |
| 2014/0132677 A1 | 5/2014 | Kondo |
| 2014/0307034 A1 | 10/2014 | Kojima |
| 2015/0231883 A1 | 8/2015 | Hirai et al. |

OTHER PUBLICATIONS

Notice of Allowance dated Mar. 1, 2018 received in related U.S. Appl. No. 15/673,720.
Notice of Allowance dated Mar. 15, 2019 received in related U.S. Appl. No. 15/995,396.
Notice of Allowance dated Oct. 23, 2019 received in related U.S. Appl. No. 16/443,080.

\* cited by examiner

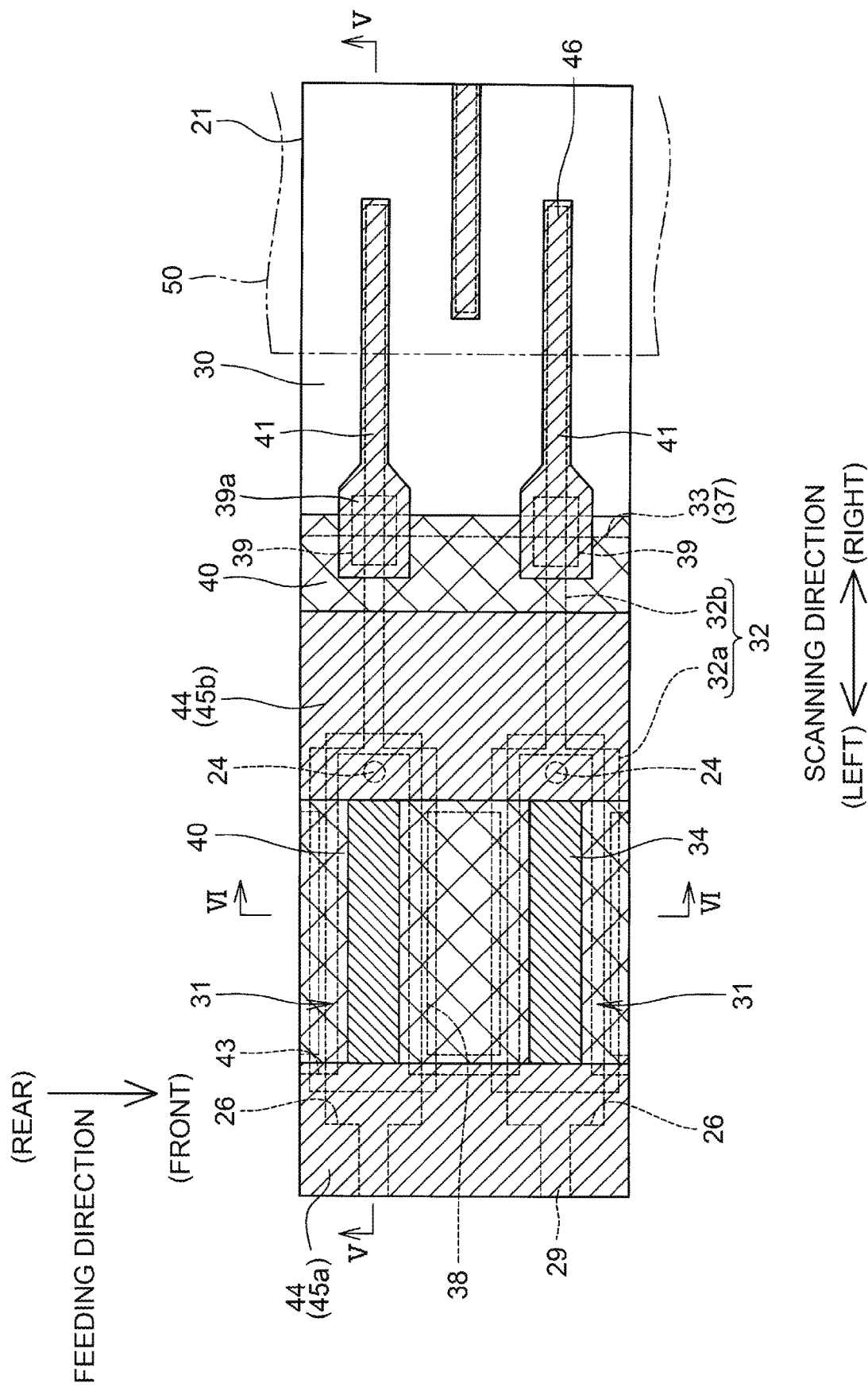

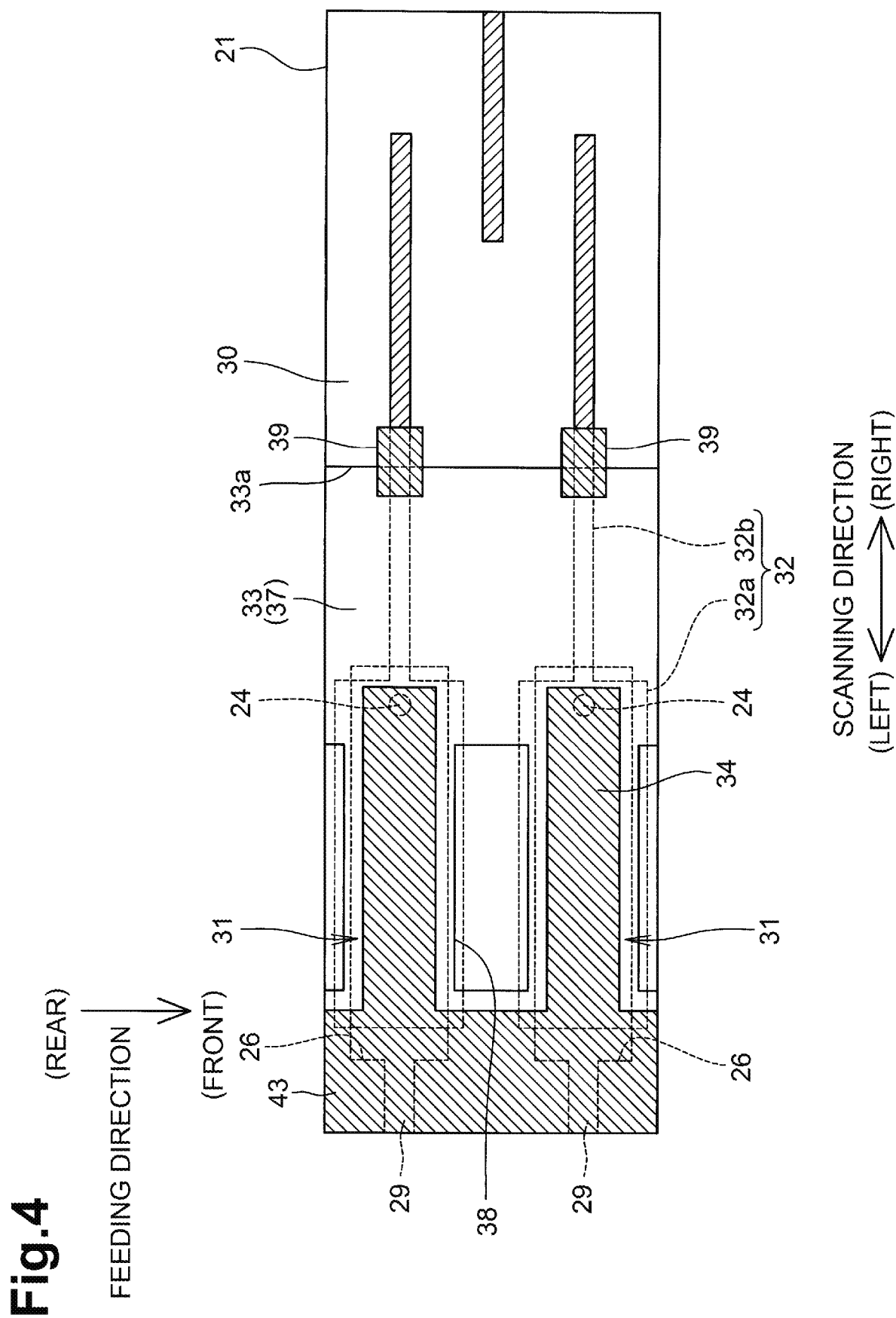

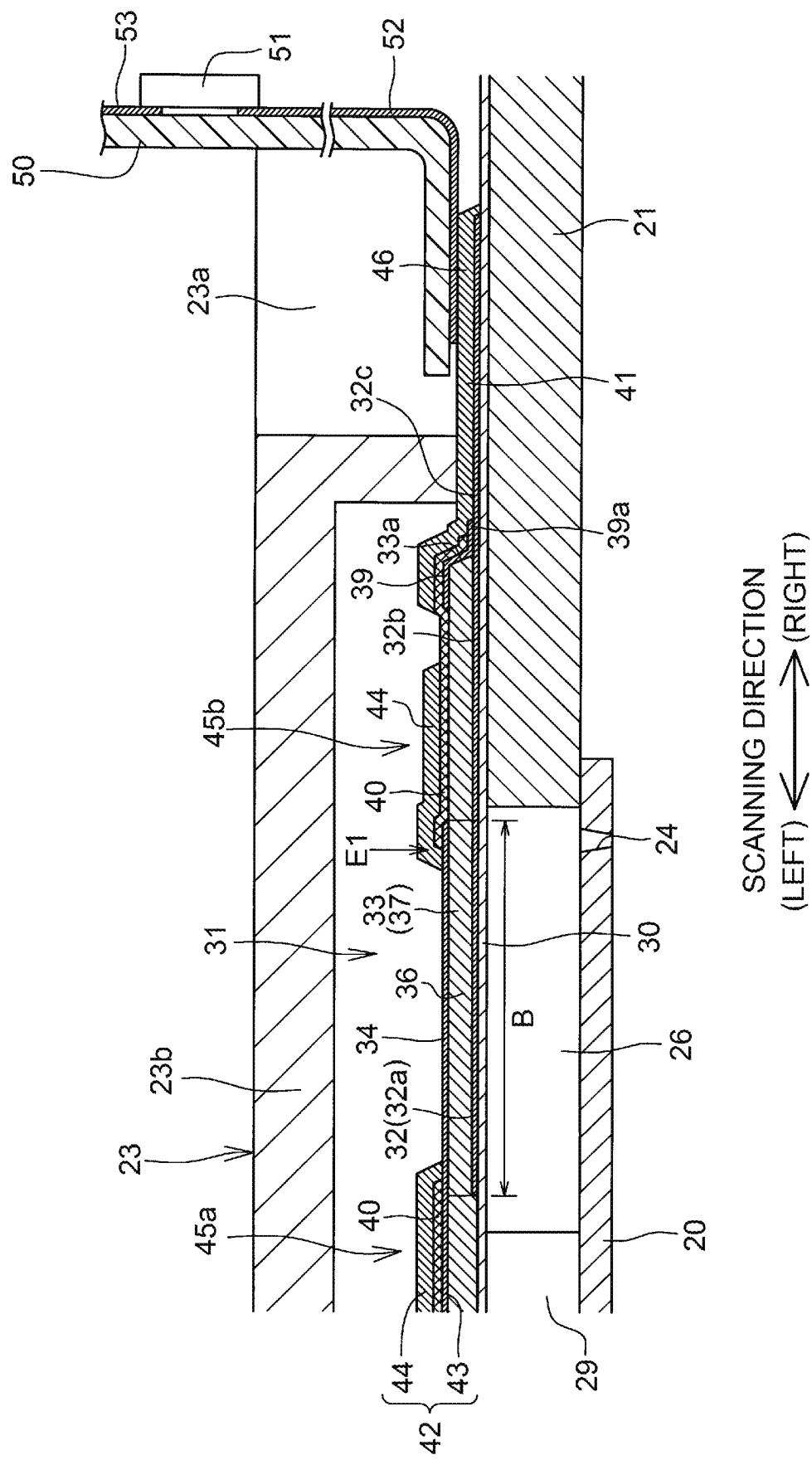

FEEDING DIRECTION (REAR) ⟶ (FRONT)

FEEDING DIRECTION
(REAR) ⟶ (FRONT)

FEEDING DIRECTION
(REAR) ⟶ (FRONT)

FEEDING DIRECTION
(REAR) ⟶ (FRONT)

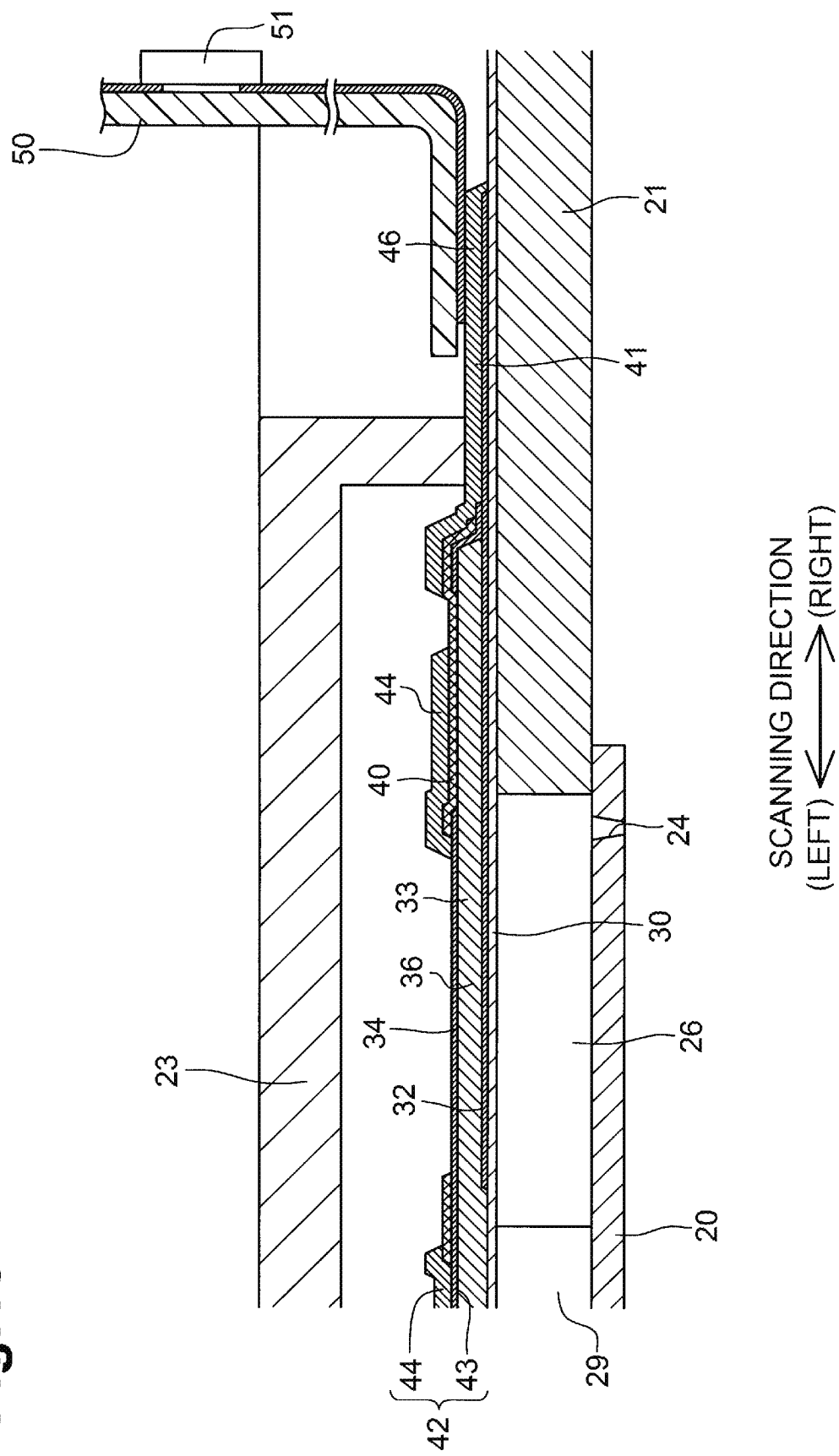

LIQUID EJECTION APPARATUS AND METHOD FOR MANUFACTURING LIQUID EJECTION APPARATUS

CROSS-REFERENCE TO RELATED APPLICATION

This application is a continuation application of U.S. application Ser. No. 16/443,080 filed on Jun. 17, 2019, which is a continuation of U.S. application Ser. No. 15/995,396 filed on Jun. 1, 2018, now U.S. Pat. No. 10,363,741 issued on Jul. 30, 2019 which is a continuation application of U.S. application Ser. No. 15/673,720 filed on Aug. 10, 2017, now U.S. Pat. No. 10,011,110 issued on Jul. 3, 2018, which is a continuation application of U.S. application Ser. No. 15/259,721 filed on Sep. 8, 2016, now U.S. Pat. No. 9,731,506 issued on Aug. 15, 2017, which claims priority from Japanese Patent Application No. 2015-192764 filed on Sep. 30, 2015, the content of which is incorporated herein by reference in its entirety.

FIELD OF DISCLOSURE

The disclosure relates to a liquid ejection apparatus and a method for manufacturing the liquid ejection apparatus.

BACKGROUND

A known liquid ejection apparatus, e.g., an inkjet head, is configured to eject ink from nozzles thereof. The inkjet head includes a channeled substrate including a plurality of pressure chambers and a piezoelectric actuator provided on the channeled substrate. Each of the pressure chambers of the channeled substrate communicates with a corresponding one of the nozzles and has a rectangular shape. In other words, each of the pressure chambers has a longitudinal direction. The pressure chambers are arranged along a transverse direction orthogonal to the longitudinal direction.

The piezoelectric actuator includes a vibration plate and a plurality of piezoelectric elements. The vibration plate is formed of, for example, silicon dioxide, and covers the pressure chambers. The piezoelectric elements are provided on the vibration plate in correspondence with the pressure chambers. Each of the piezoelectric elements includes a piezoelectric film, a lower electrode located below the piezoelectric film, and an upper electrode located above the piezoelectric film.

The lower electrode is an individual electrode individually provided for each pressure chamber. The lower electrode is disposed on the vibration plate, overlapping a central portion of the pressure chamber in its transverse direction. The upper electrode is disposed overlapping almost the entire area of the pressure chamber with respect to its transverse direction. The upper electrodes are electrically connected to each other between the piezoelectric elements, and the same potential is applied to the upper electrodes. The upper electrodes constitute a common electrode shared among the piezoelectric elements.

A portion of the piezoelectric film between the lower electrode and the upper electrode is an active portion configured to deform when a voltage is applied between the two electrodes. As described above, the upper electrode overlaps the almost entire area of the pressure chamber with respect to its transverse direction. Accordingly, a position of each end of the active portion with respect to the transverse direction is determined by a position of a corresponding end of the lower electrode.

SUMMARY

In the liquid ejection apparatus, the lower electrode is disposed on an upper surface of the vibration plate, overlapping the central portion of the pressure chamber with respect to the transverse direction. In other words, in a region of the upper surface of the vibration plate overlapping the pressure chamber with respect to its transverse direction, the lower electrode is disposed at a central portion of the region, but is not at end portions of the region. Therefore, a portion of the piezoelectric film is formed on the lower electrode at the central portion of the region, but other portions of the piezoelectric film is formed directly on the vibration plate at the end portions of the region.

The crystal growth of piezoelectric material may differ between cases where the piezoelectric film is formed directly on the vibration plate including, for example, silicon dioxide, e.g., an amorphous layer, and where the piezoelectric film is formed on the lower electrode, e.g., a crystalline layer. Therefore, a portion of the piezoelectric film formed at the central portion of the region and the other portions of the piezoelectric film formed at the end portions of the region may differ with respect to a crystal orientation direction. This may cause discontinuous crystallinity in piezoelectric film between the central portion and the end portions of the region. Further, in the liquid ejection apparatus, positions of ends of the active portion with respect to the transverse direction is determined by the lower electrode. Therefore, an end portion of the active portion may have discontinuous crystallinity. Therefore, when a voltage is applied to the piezoelectric element to deform the active portion, non-uniform distortion may occur at the end portion of the active portion where crystallinity is discontinuous. This may cause a crack in the piezoelectric film, and the element may be damaged.

One or more aspects of the disclosure are to realize a structure that reduces discontinuous crystallinity of a piezoelectric material at an end portion of an active portion including a piezoelectric film formed of the piezoelectric material, and to prevent or reduce occurrence of a crack in the piezoelectric film when the active portion deforms.

According to an aspect of the disclosure, a liquid jetting head comprises pressure chambers, an insulating film, piezoelectric elements and a common trace. The pressure chambers are arranged along an arrangement direction. The insulating films cover the pressure chambers. The piezoelectric elements respectively correspond to the pressure chambers, e.g., one-to-one correspondence. Each piezoelectric element comprises a lower electrode disposed above the insulating film, a piezoelectric film disposed above the lower electrode and an upper electrode disposed above the piezoelectric film. The common trace is connected to the upper electrode and another upper electrode. The upper electrode and the another upper electrode are disposed side by side in the arrangement direction. The lower electrode has a wide portion and a narrow portion narrower than the wide portion in the arrangement direction. The wide portion at least partially overlaps its corresponding pressure chamber in an orthogonal direction. The orthogonal direction is orthogonal to the arrangement direction. The wide portion has two ends in the arrangement direction. A distance from the center of the corresponding pressure chamber in the arrangement direction to one of the two ends of the pressure chamber in the arrangement direction is smaller than a distance from the center of the same pressure chamber in the arrangement direction to a corresponding one of the two ends of the wide portion in the arrangement direction.

In other aspects, a distance from the center of a corresponding pressure chamber in the arrangement direction to one of two ends of the upper electrode in the arrangement direction is smaller than a distance from the center of the same pressure chamber in the arrangement direction to the corresponding one of the two ends of the pressure chamber in the arrangement direction.

In other aspects, a distance from the center of a corresponding pressure chamber in the arrangement direction to one of two ends of the upper electrode in the arrangement direction is smaller than a distance from the center of the same pressure chamber in the arrangement direction to a corresponding one of two ends of the piezoelectric film in the arrangement direction.

In other aspects, a distance from the center of a corresponding pressure chamber in the arrangement direction to one of the two ends of the corresponding piezoelectric film in the arrangement direction is smaller than a distance from the center of the same pressure chamber in the arrangement direction to a corresponding one of the two ends of the wide portion in the arrangement direction.

Also disclosed is a printer. In an aspect of the disclosure, the printer comprises a feeding mechanism and a liquid jetting head. The feeding mechanism is configured to feed a recording sheet in a feeding direction.

The liquid jetting head comprises pressure chambers, an insulating film, piezoelectric elements and a common trace. The pressure chambers are arranged along the feeding direction. The insulating films cover the pressure chambers. The piezoelectric elements respectively correspond to the pressure chambers, e.g., one-to-one correspondence. Each piezoelectric element comprises a lower electrode disposed above the insulating film, a piezoelectric film disposed above the lower electrode and an upper electrode disposed above the piezoelectric film. The common trace is connected to the upper electrode and another upper electrode. The upper electrode and the another upper electrode are disposed side by side in the feeding direction. The lower electrode has a wide portion and a narrow portion narrower than the wide portion in the feeding direction. The wide portion at least partially overlaps its corresponding pressure chamber in an orthogonal direction. The orthogonal direction is orthogonal to the feeding direction. The wide portion has two ends in the feeding direction. A distance from the center of the corresponding pressure chamber in the feeding direction to one of the two ends of the pressure chamber in the feeding direction is smaller than a distance from the center of the same pressure chamber in the feeding direction to a corresponding one of the two ends of the wide portion in the feeding direction.

In other aspects, a distance from the center of a corresponding pressure chamber in the feeding direction to one of two ends of the upper electrode in the feeding direction is smaller than a distance from the center of the same pressure chamber in the feeding direction to the corresponding one of the two ends of the pressure chamber in the feeding direction.

In other aspects, a distance from the center of a corresponding pressure chamber in the feeding direction to one of two ends of the upper electrode in the feeding direction is smaller than a distance from the center of the same pressure chamber in the feeding direction to a corresponding one of two ends of the piezoelectric film in the feeding direction.

In other aspects, a distance from the center of a corresponding pressure chamber in the feeding direction to one of the two ends of the corresponding piezoelectric film in the feeding direction is smaller than a distance from the center of the same pressure chamber in the feeding direction to a corresponding one of the two ends of the wide portion in the feeding direction.

According to some aspects, methods for manufacturing the liquid jetting head and the printer in accordance with aspects of the disclosure are disclosed.

BRIEF DESCRIPTION OF THE DRAWINGS

FIG. 3 is an enlarged view of a portion A in FIG. 2.

FIG. 4 is an enlarged view of the portion A from which an insulating film, an individual trace, and a thick trace depicted in FIG. 3 are removed.

FIG. 5A is a cross-sectional view taken along a line V-V in FIG. 3. FIG. 5B is a cross-sectional view taken along a line V-V in FIG. 3, wherein FIG. 5B shows one modification of illustrative embodiment.

FIGS. 7A-7E depict manufacturing processes of the head unit, wherein FIG. 7A depicts a process of forming the insulating film; FIG. 7B depicts a process of forming a lower electrode; FIG. 7C depicts a process of forming a piezoelectric film; FIG. 7D depicts a process of forming an upper electrode; and FIG. 7E depicts a process of forming a piezoelectric film for protecting the insulating film.

FIGS. 8A and 8B depict manufacturing processes of the head unit, wherein FIG. 8A depicts a process of forming pressure chambers; and FIG. 8B depicts a process of bonding a nozzle plate.

FIG. 13 is a cross-sectional view of a head unit according to still yet another modification of the illustrative embodiment, wherein FIG. 13 corresponds to FIG. 5A.

DETAILED DESCRIPTION

Figure 1:
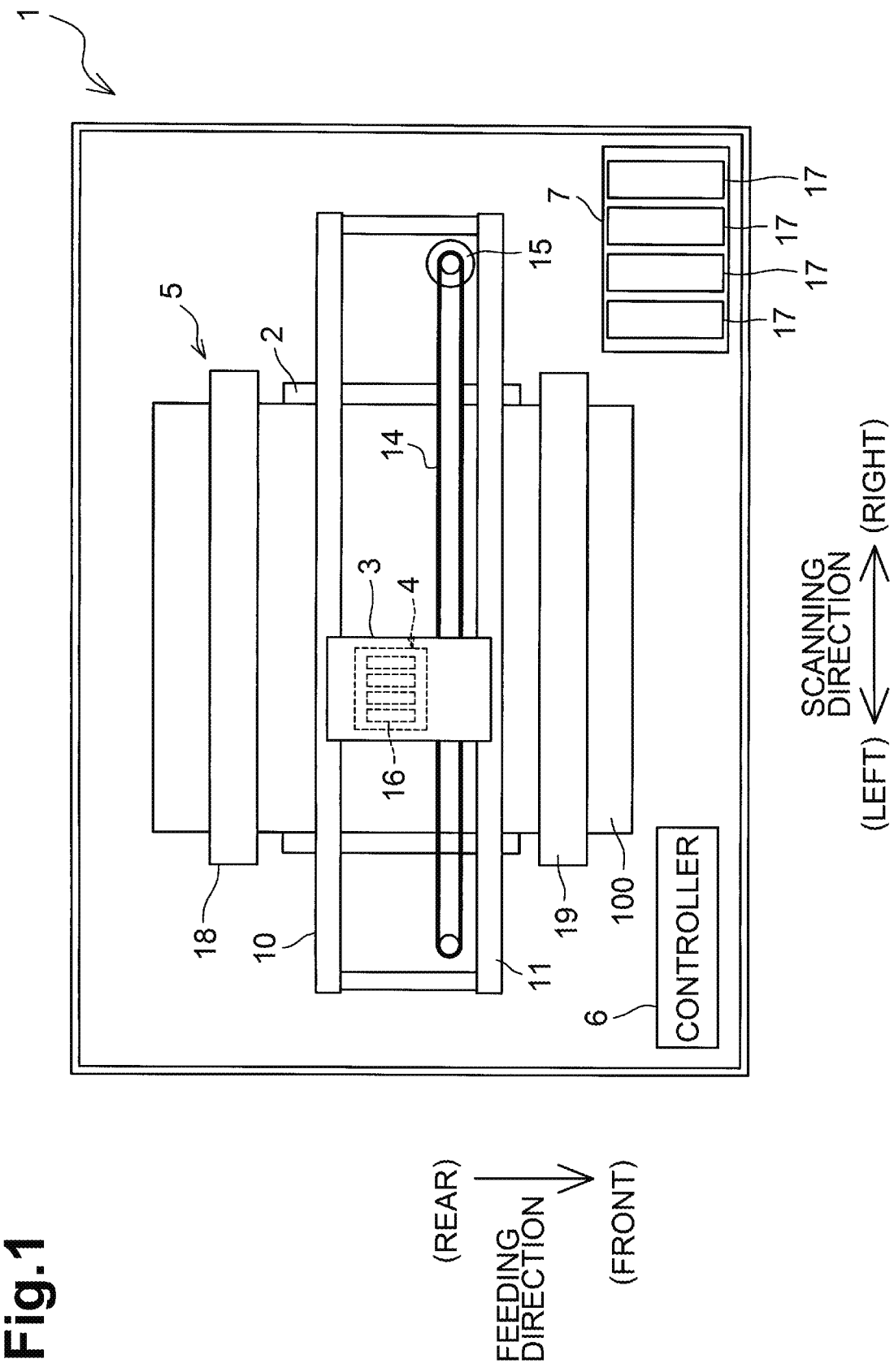
FIG. 1 is a schematic plan view of a printer in an illustrative embodiment according to one or more aspects of the disclosure.

An illustrative embodiment of the disclosure will be described. FIG. 1 is a plan view of a printer in an illustrative embodiment according to one or more aspects of the disclosure. Referring to FIG. 1, general structures of an inkjet printer 1 will be described. The front, rear, left, and right sides of the printer 1 are defined as depicted in FIG. 1. The front or near side and the back side of the sheet of FIG. 1 are defined as the top/upper side and the bottom/lower side of the printer 1, respectively. Hereinafter, description will be made with reference to directions as defined above.

(General Structures of Printer)

As depicted in FIG. 1, the inkjet printer 1 includes a platen 2, a carriage 3, an inkjet head 4, a feeding mechanism 5, and a controller 6.

A recording medium, e.g., a recording sheet 100, is placed on an upper surface of the platen 2. The carriage 3 is configured to reciprocate along two guide rails 10 and 11 in the left-right direction (which may be referred to as the scanning direction hereinafter) at a region opposing the platen 2. An endless belt 14 is connected to the carriage 3. A carriage drive motor 15 drives the endless belt 14 to move the carriage 3 in the scanning direction.

The inkjet head 4 is mounted on the carriage 3. The inkjet head 4 is configured to move together with the carriage 3 in the scanning direction. The inkjet head 4 includes four head units 16 aligned in the scanning direction. The four head units 16 are connected by tubes (not depicted) to a cartridge holder 7 on which ink cartridges 17 of four colors (e.g., black, yellow, cyan, and magenta) are mounted. Each of the head units 16 has a plurality of nozzles 24 (refer to FIGS. 2-6) formed on a lower surface thereof (e.g., the back side of the sheet of FIG. 1). The nozzles 24 of the respective head units 16 are configured to eject ink supplied from the corresponding ink cartridges 17, toward the recording sheet 100 placed on the platen 2.

The feeding mechanism 5 includes two feeding rollers 18 and 19 sandwiching the platen 2 therebetween in the front-rear direction. The feeding mechanism 5 is configured to feed the recording sheet 100 placed on the platen 2 with the feeding rollers 18 and 19 in a frontward direction (which may be referred to as the feeding direction hereinafter).

The controller 6 includes a read only memory (ROM), a random access memory (RAM), and an application specific integrated circuit (ASIC) including various control circuits. The controller 6 is configured to execute various processing, e.g., printing onto the recording sheet 100, based on programs stored in the ROM, with the ASIC. For example, in print processing, the controller 6 controls the inkjet head 4 and the carriage drive motor 15 to print, for example, an image, on the recording sheet 100, based on a print command input from an external device, e.g., a personal computer (PC). More specifically, an ink ejection operation and a feeding operation are alternately performed. In the ink ejection operation, ink is ejected while the inkjet head 4 is moved together with the carriage 3 in the scanning direction. In the feeding operation, the recording sheet 100 is fed in the feeding direction by a predetermined amount by the feeding rollers 18 and 19.

(Details of Inkjet Head)

Next, structures of the four head units 16 of the inkjet head 4 will be described in detail. The four head units 16 have the same or similar structures, so that one of the head units 16 will be described below.

Figure 2:
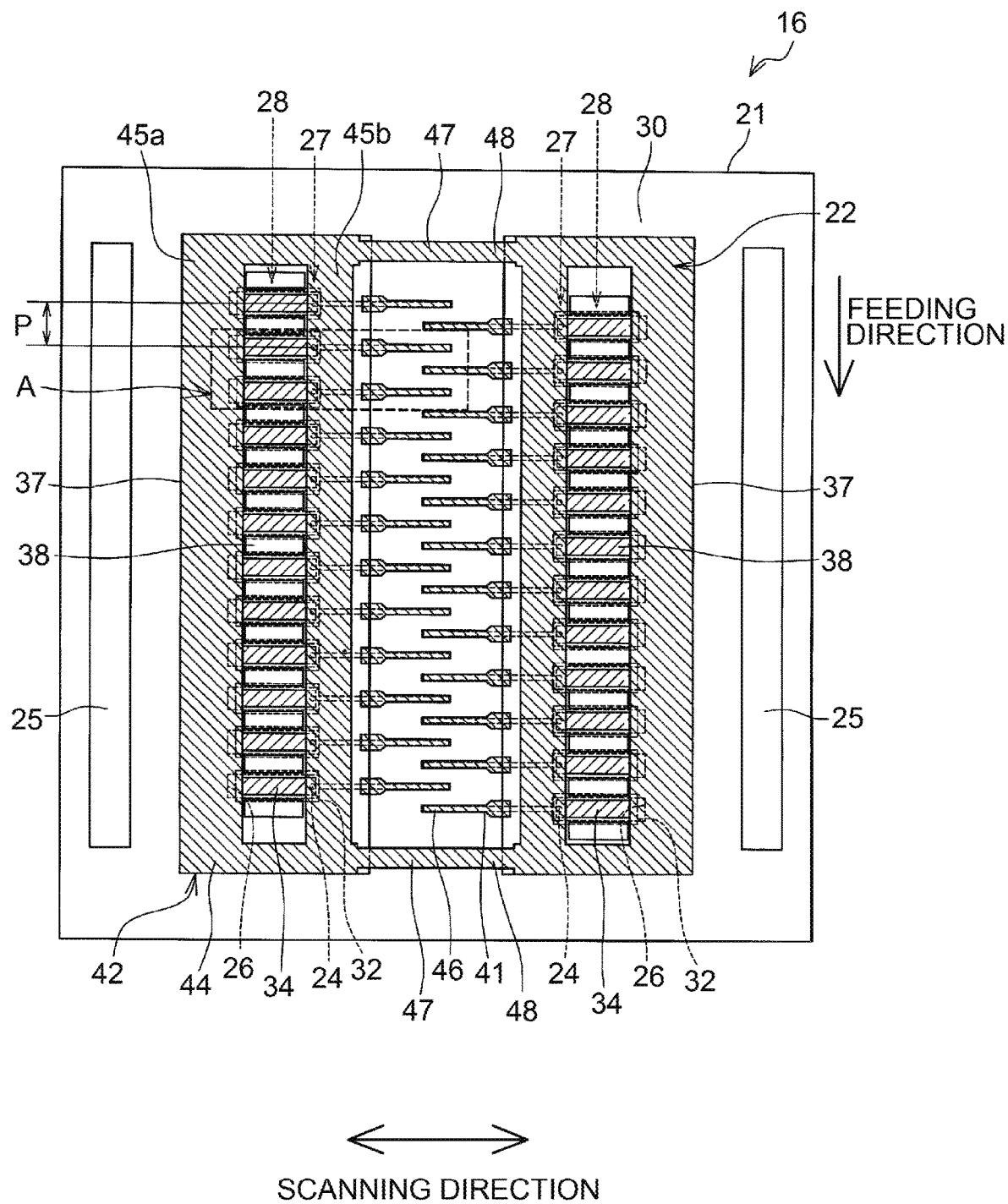
FIG. 2 is a plan view of a head unit.

FIG. 2 is a plan view of the head unit 16. FIG. 3 is an enlarged view of a portion A in FIG. 2. FIG. 4 is an enlarged view of the portion A from which an insulating film 40, an individual trace 41, and a thick trace 44 depicted in FIG. 3 are removed. FIG. 5A is a cross-sectional view taken along a line V-V in FIG. 3. FIG. 6 is a cross-sectional view taken along a line VI-VI in FIG. 3. As depicted in FIGS. 2-6, the head unit 16 includes a nozzle plate 20, a channeled substrate 21, a piezoelectric actuator 22, a Chip On Film (COF) 50, and a cover member 23. For simplicity of illustration, the cover member 23 disposed above the channeled substrate 21 and the COF 50 are omitted in FIG. 2. In FIG. 3, the COF 50 is schematically shown by a two-dot chain line.

(Nozzle Plate)

The nozzle plate 20 is a plate formed of, for example, silicon. The nozzle plate 20 has the nozzles 24 formed therein. As depicted in FIG. 2, the nozzles 24 are arranged along the feeding direction. The nozzles 24 constitute two nozzle rows 27 aligned in the scanning direction. In each nozzle row 27, the nozzles 24 are arranged in a pitch P. Positions of the nozzles 24 of the two nozzle rows 27 are mutually deviated in the feeding direction by a half of the pitch P (P/2).

(Channeled Substrate)

The channeled substrate 21 includes a silicon single crystal substrate. The channeled substrate 21 includes a plurality of pressure chambers 26 communicating with the corresponding nozzles 24. Each of the pressure chambers 26 has a rectangular planar shape elongated in the scanning direction. The pressure chambers 26 are arranged along the feeding direction in accordance with the arrangement of the nozzles 24. The pressure chambers 26 constitute two pressure chamber rows 28 arranged in the scanning direction. A lower surface of the channeled substrate 21 is covered by the nozzle plate 20. When viewed from the top-bottom direction, an inner end portion of each pressure chamber 26 in the scanning direction, e.g., an end portion of the pressure chamber 26 closer to the center of the channeled substrate 21 in the scanning direction, overlaps a corresponding nozzle 24. In the description, "an inner side", "an inner portion," and "an inner end" in the scanning direction may be used to describe a side, a portion, and an end closer to the center of the head unit 16 in the scanning direction, respectively.

As depicted in FIG. 2, two manifolds 25 are formed at left and right end portions of the channeled substrate 21 in correspondence with the respective pressure chamber rows 28. Each manifold 25 extends along the feeding direction. As depicted in FIGS. 3-5, each of the pressure chambers 26, which constitute one pressure chamber row 28, is connected to a corresponding manifold 25 by a corresponding throttle channel 29. The throttle channel 29 extends in the scanning direction.

The manifold 25 has an open end on an upper surface of the channeled substrate 21. An opening of the manifold 25 is connected to the cartridge holder 7 by an ink supply member (not depicted) including, for example, the tubes. Ink in the ink cartridge 17 of the cartridge holder 7 flows into the manifold 25 via the ink supply member. Then, the ink is supplied from the manifold 25 to the respective pressure chambers 26, via the corresponding throttle channels 29.

(Piezoelectric Actuator)

The piezoelectric actuator 22 is a laminated body including a plurality of films. The piezoelectric actuator 22 includes an insulating film 30, a plurality of piezoelectric elements 31, the insulating film 40 for protecting the piezoelectric elements 31, individual traces 41, and a common trace 42. The piezoelectric actuator 22 is disposed on the channeled substrate 21, covering the pressure chambers 26.

<Insulating Film 30>

The insulating film 30 is a silicon dioxide film formed by, for example, oxidizing a surface of the silicon channeled substrate 21. The thickness of the insulating film 30 is, for example, 1.0-1.5 μm. Each piezoelectric element 31 is disposed at a portion of an upper surface of the insulating film 30 overlapping a corresponding one of the pressure chambers 26. The piezoelectric element 31 is configured to apply, to ink in the pressure chamber 26, ejection energy for ejecting ink from the corresponding nozzle 24.

<Piezoelectric Elements 31>

Structures of the piezoelectric elements 31 will be described. Each of the piezoelectric elements 31 includes a lower electrode 32 disposed above the insulating film 30, a piezoelectric film 33 disposed above the lower electrode 32, and an upper electrode 34 disposed above the piezoelectric film 33.

The lower electrode 32 is disposed at a portion of the upper surface of the insulating film 30 overlapping the pressure chamber 26. The lower electrode 32 is a so-called individual electrode. An individual drive signal is supplied from a driver IC 51 (described below) to the individual electrode, e.g., the lower electrode 32, via the corresponding individual trace 41. In a structure in which the lower electrode 32 on the insulating film 30 serves as the individual electrode, a trace for supplying the drive signal to the lower electrode 32 may be formed on the insulating film 30, which is flat. Accordingly, the trace may be readily formed and may not readily break.

The lower electrode 32 includes a wide portion 32a and a narrow portion 32b. The wide portion 32a is an example of a partial overlapping portion. The narrow portion 32b is an example of a non-overlapping portion. The wide portion 32a has a rectangular shape elongated in the scanning direction. The narrow portion 32b is disposed on an inner side of the piezoelectric actuator 22 in the scanning direction relative to the wide portion 32a. As depicted in FIGS. 3 and 5, the wide portion 32a is disposed overlapping a central portion of the pressure chamber 26 in its longitudinal direction, e.g., the scanning direction. As depicted in FIGS. 3, and 6, each end of the wide portion 32a with respect to the transverse direction of the pressure chamber 26, e.g., the feeding direction, is located further from a corresponding end of the pressure chamber 26 with respect to the feeding direction. In other words, the wide portion 32a is partially located beyond an edge of the pressure chamber 26 with respect to the feeding direction. As depicted in FIG. 3, with respect to the feeding direction, the width of the narrow portion 32b is smaller than the width of the wide portion 32a. The narrow portion 32b is lead from an inner end portion of the wide portion 32a in the scanning direction (e.g., a right end portion of the wide portion 32a in FIG. 3) and extends to a portion between the two pressure chamber rows 28. The lower electrode 32 includes, for example, platinum (Pt). The thickness of the lower electrode 32 is, for example, 0.1 μm.

The piezoelectric film 33 is formed of piezoelectric material, e.g., lead zirconate titanate (PZT). In another embodiment, the piezoelectric film 33 may be formed of a lead-free piezoelectric material that does not include lead, instead of PZT. The thickness of the piezoelectric film 33 is, for example, 1.0-2.0 μm. More specifically, in the illustrative embodiment, the piezoelectric film 33 of the piezoelectric elements 31 is connected along the feeding direction, constituting a piezoelectric body 37. The piezoelectric body 37 has a rectangular shape elongated along the feeding direction, as depicted in FIGS. 2 and 3. In other words, two piezoelectric bodies 37 including the piezoelectric film 33 are disposed on the insulating film 30 in correspondence with the two pressure chamber rows 28.

As depicted in FIG. 5A, the narrow portion 32b of the lower electrode 32 extends in the scanning direction toward the center of channeled substrate 21 beyond a side surface 33a of the piezoelectric film 33. The side surface 33a is provided at an inner side of the piezoelectric film 33 in the scanning direction (e.g., a right side of the piezoelectric film 33 in FIG. 5A). The narrow portion 32b includes a first exposed portion 32c exposed from the side surface 33a and extending toward the center of channeled substrate 21 in the scanning direction. The lower electrode 32 is connected to the individual trace 41 (described below), via the first exposed portion 32c of the narrow portion 32b.

As depicted in FIGS. 2-4 and 6, a slit 38 is formed at a portion of the piezoelectric body 37 between the pressure chambers 26. The slit 38 extends in the scanning direction. The slit 38 is provided between two pressure chambers 26 that are adjacent along the feeding direction. With the slit 38, a portion of the piezoelectric film 33 corresponding to one pressure chamber 26 includes two side surfaces 33b with respect to the feeding direction, as depicted in FIG. 6. With respect to the feeding direction, each end of the lower electrode 32 is located beyond a corresponding end of the pressure chamber 26, and a corresponding side surface 33b of the piezoelectric film 33.

The upper electrode 34 is disposed at a portion of an upper surface of the piezoelectric film 33 overlapping the pressure chamber 26. The upper electrode 34 has a rectangular planar shape elongated in the scanning direction, similar to the wide portion 32a of the lower electrode 32. The upper electrode 34 is formed of, for example, iridium. The thickness of the upper electrode 34 is, for example, 0.1 μm.

As depicted in FIGS. 3 and 6, with respect to the transverse direction of the pressure chamber 26, e.g., the feeding direction, the width of the upper electrode 34 is smaller than the width of the wide portion 32a. With respect to the feeding direction, each end of the upper electrode 34 is located closer to the center of the pressure chamber 26 than a corresponding end of the lower electrode 32. The upper electrodes 34 of the piezoelectric elements 31 are connected to each other by the common trace 42 (described below). A ground potential is applied to the upper electrodes 34.

The piezoelectric film 33 of each piezoelectric element 31 is sandwiched between the lower electrode 32 and the upper electrode 34 at a region facing the pressure chamber 26. A portion of the piezoelectric film 33 sandwiched between the lower electrode 32 and the upper electrode 34 is hereinafter referred to as the active portion 36. In each piezoelectric element 31, an electric field in a thickness direction of the active portion 36 may be applied to active portion 36 due to a potential difference between the lower electrode 32 and the upper electrode 34. This may cause the active portion 36 to deform in its planar direction, e.g., a direction perpendicular to a thickness direction of the active portion 36. In response to the deformation of the active portion 36, the piezoelectric element 31 as a whole deforms. Accordingly, a portion of the piezoelectric element 31 facing the pressure chamber 26 deforms in the top-bottom direction orthogonal to a planar direction of the insulating film 30.

As described above, in the illustrative embodiment, with respect to the feeding direction, each end of the upper electrode 34 is located closer to the center of the pressure chamber 26 than a corresponding end of the lower electrode 32, as depicted in FIG. 6. In other words, a position of each end of the active portion 36 with respect to the feeding direction is determined by a position of a corresponding end of the upper electrode 34. The piezoelectric film 33 includes a central portion 33x located closer to the center of the pressure chamber 26 with respect to the feeding direction than the respective ends of the upper electrode 34 with respect to the feeding direction. The piezoelectric film 33 further includes an end portion 33y located on an end portion thereof with respect to the feeding direction. The central portion 33x and the end portion 33y are both formed above the lower electrode 32. Therefore, in the central portion 33x, which is a portion of the active portion 36, and the end portion 33y, which is not a portion of the active portion 36, crystals of the piezoelectric material is preferentially oriented to a predetermined plane, e.g., a (100) plane. More specifically, an end portion of the active portion 36 may not have discontinuous crystallinity, which may prevent or reduce occurrence of a crack in the piezoelectric film 33 when the active portion 36 deforms. The expression "preferentially oriented to a (100) plane" includes a case in which all of the crystals of the piezoelectric film 33 are oriented to the (100) plane and a case in which 90% or more of the crystals are oriented to the (100) plane.

To preferentially orient the piezoelectric film 33 in a predetermined plane, the lower electrode 32 preferably includes platinum (Pt). Platinum is oriented by itself regardless of conditions of an underlying substrate. Platinum crystallizes into a face-centered cubic (FCC) lattice structure that is a close-packed structure. Therefore, the platinum layer may be oriented to a predetermined plane direction even on, for example, an amorphous silicon dioxide layer, e.g., the insulating film 30. Accordingly, the piezoelectric film 33 formed on the lower electrode 32 whose crystal direction are aligned in one direction. In another embodiment, a seed layer may be provided between the lower electrode 32 and the piezoelectric film 33 to control crystal growth on the piezoelectric film 33. A material for the seed layer may be appropriately selected from known materials, e.g., titanium oxide, lead titanate, and PZT.

Especially, in the illustrative embodiment, each end of the lower electrode 32 with respect to the feeding direction is located beyond a corresponding end of the pressure chamber 26. The lower electrode 32 is provided across the pressure chamber 26 with respect to the feeding direction. Accordingly, discontinuous crystallinity may not readily occur at a region of the piezoelectric film 33 overlapping the pressure chamber 26.

The lower electrode 32 is formed extending beyond each end of the pressure chamber 26 with respect to the feeding direction. Therefore, the lower electrode 32 may prevent or reduce reduction in the thickness of a portion of the insulating film 30 located below the piezoelectric film 33 and covering the pressure chamber 26, when the piezoelectric film 33, which is first entirely formed over the upper surface of the insulating film 30, is etched to form the side surfaces 33b.

With respect to the feeding direction, each end of the lower electrode 32 is located beyond a corresponding one of the two side surfaces 33b of the piezoelectric film 33. In other words, with respect to the feeding direction, an entire portion of the piezoelectric film 33 is disposed above the lower electrode 32. Accordingly, the piezoelectric film 33 may not have discontinuous crystallinity as described above.

As depicted in FIG. 5A, a conductive film 39 is located on a side of the piezoelectric film 33 closer to the first exposed portion 32c of the lower electrode 32. The conductive film 39 is formed of the same material as the upper electrodes 34 (e.g., iridium). The conductive film 39 is provided at an end portion of the piezoelectric film 33 and the first exposed portion 32c. The conductive film 39 extends from an upper surface of the piezoelectric film 33 to an upper surface of the first exposed portion 32c, through the side surface 33a of the piezoelectric film 33. The conductive film 39 is formed at the time of patterning the upper electrodes 34. As will be described later, a conductive film is formed throughout a surface of the piezoelectric film 33 and the conductive film is patterned by etching, to form the upper electrodes 34. During the etching process, the conductive film 39 covering the first exposed portion 32c is intentionally left, to prevent the first exposed portion 32c disposed below the conductive film 39 from being etched.

<Insulating Film 40>

As described above, in the illustrative embodiment, with respect to the feeding direction, the width of the upper electrode 34 is smaller than the width of the wide portion 32a. Therefore, the upper electrode 34 does not cover a portion of a surface of the piezoelectric film 33. The insulating film 40 is provided for protecting the piezoelectric film 33 at the portion of the surface of the piezoelectric film 33 that is not covered by the upper electrode 34. The insulating film 40 may prevent or reduce moisture from externally entering into the piezoelectric film 33.

More specifically, as depicted in FIGS. 3 and 5, the insulating film 40 is provided on an upper surface of the piezoelectric film 33 of each piezoelectric element 31 around the upper electrode 34. The insulating film 40 slightly overlaps a peripheral edge portion of the upper electrode 34. In other words, in the upper surface of the piezoelectric film 33, a central portion of the upper electrode 34 is exposed from the insulating film 40. Therefore, the insulating film 40 may not inhibit the deformation of the active portion 36. The insulating film 40 covers the side surface 33a with respect to the scanning direction, and the side surfaces 33b with respect to the feeding direction, from the upper surface of the piezoelectric film 33.

As depicted in FIG. 5A, the insulating film 40 covers a portion of the conductive film 39 provided on an inner end portion (e.g., a right end portion in FIG. 5A) of the piezoelectric film 33 in the scanning direction, but does not cover another portion, e.g., an inner end portion of the conductive film 39 in the scanning direction, provided on the first exposed portion 32c. The another portion is a second exposed portion 39a exposed from the insulating film 40.

A portion of the piezoelectric film 33 overlapping an edge portion of the pressure chamber 26 may readily have a crack when the active portion 36 deforms. However, in the illustrative embodiment, as depicted in FIG. 5A, in an inner end portion of the piezoelectric film 33 in the scanning direction (e.g., a right end portion in FIG. 5A), the insulating film 40 covers an end portion of the upper electrode 34, and the side surface 33a of the piezoelectric film 33. An end E1 (e.g., a left end of a right portion of the insulating film 40 in FIG. 5A) is located closer to the center of the pressure chamber 26 than an edge of the pressure chamber 26. In other words, the insulating film 40 overlaps an edge portion of the pressure chamber 26 with respect to the scanning direction. Therefore, a curvature radius of a deformed shape of the piezoelectric film 33 may become relatively great at a position corresponding the edge portion of the pressure chamber 26. Accordingly, a crack may be prevented or reduced. Further, the end E1 of the insulating film 40 is located closer to the center of the pressure chamber 26 than an end of a region B where the wide portion 32a of the lower electrode 32 overlaps the upper electrode 34 vertically. In short, the insulating film 40 overlaps the active portion 36. Accordingly, a crack in the piezoelectric film 33 may further be prevented or reduced.

Further, as depicted in FIG. 6, the insulating film 40 extends along the feeding direction from an upper surface of the upper electrode 34 to an upper surface of the insulating film 30, via an upper surface of the piezoelectric film 33 and the side surface 33b. In other words, the insulating film 40 covers end portions of the lower electrode 32, each extending beyond a corresponding one of the two side surfaces 33b of the piezoelectric film 33. Thus, a portion of the insulating film 40 covers an upper surface of the piezoelectric film 33 to an end portion of the lower electrode 32 located beyond the piezoelectric film 33 through the side surface 33b, so that the piezoelectric film 33 may be protected and further electrical insulation between the lower electrodes 32 may increase.

<Individual Traces 41>

As depicted in FIG. 5A, the individual trace 41 is disposed overlapping the first exposed portion 32c of the lower electrode 32. The individual trace 41 is electrically connected to the lower electrode 32, via the first exposed portion 32c. The individual trace 41 is formed of, for example, gold (Au). The individual trace 41 is thicker than the lower electrode 32 and has a thickness of, for example, 1.0 μm.

As described above, an end portion of the conductive film 39 is the second exposed portion 39a, which exposed from the insulating film 40. An end portion of the individual trace 41 overlaps the first exposed portion 32c of the lower electrode 32 and the second exposed portion 39a of the conductive film 39.

Figure 5B:
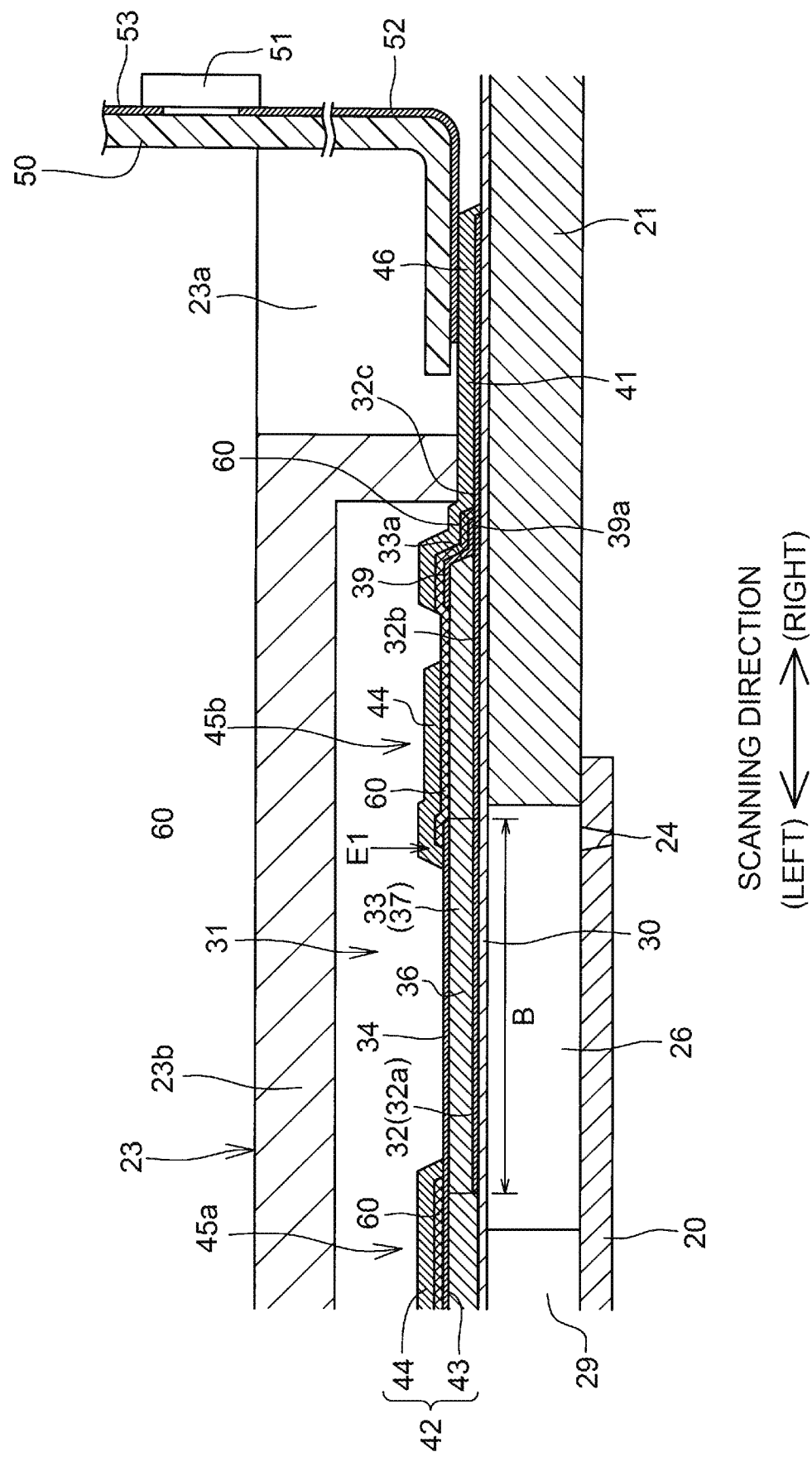
Figure 6:
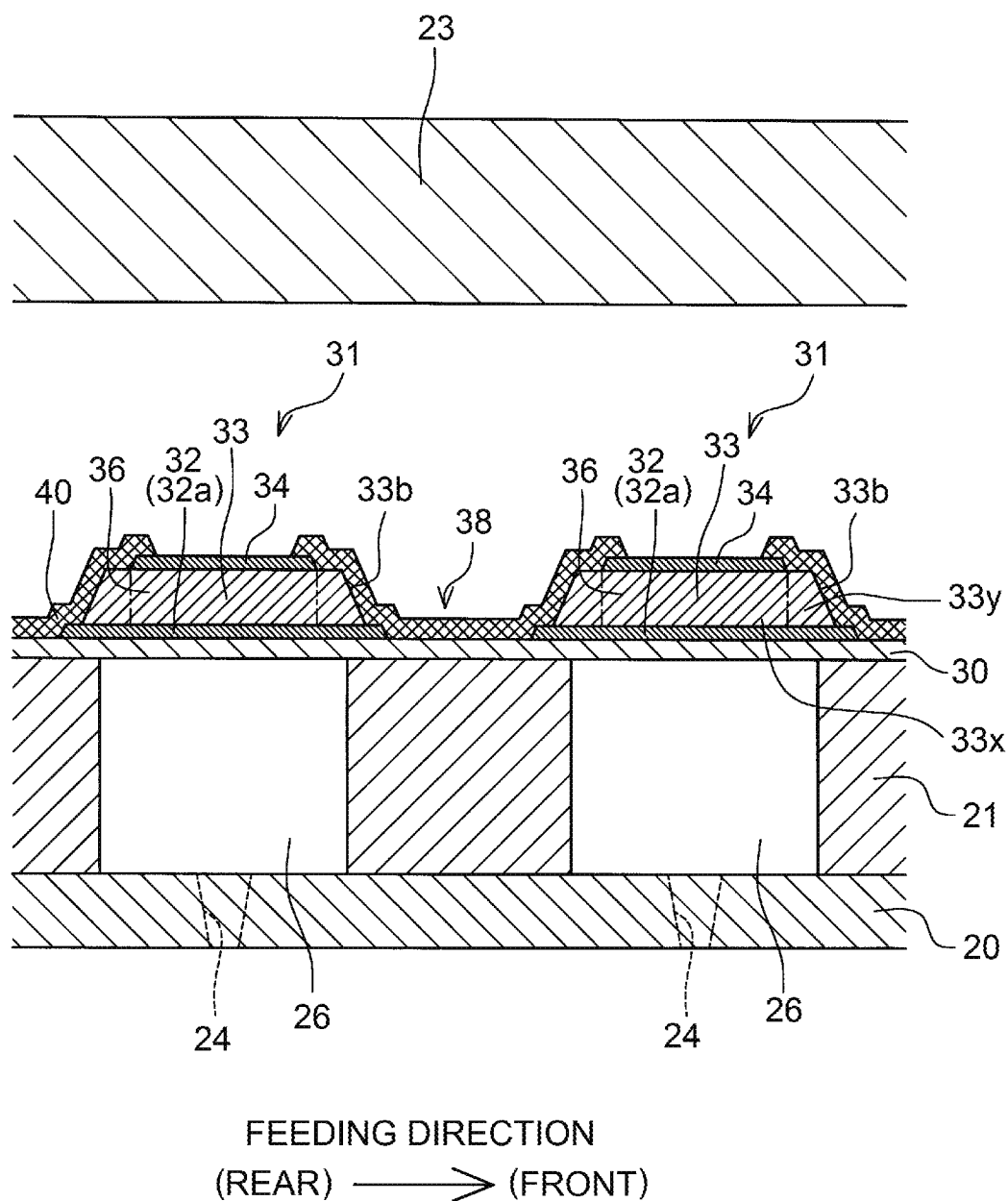
FIG. 6 is a cross-sectional view taken along a line VI-VI in FIG. 3.

FIG. 5B shows one of modification of the illustrative embodiment. The modification includes an insulating film 60 instead of the insulating film 40. In this modification, an insulating film 60 is disposed between the individual trace 41 and conductive film 39. As depicted in FIG. 5B, if the insulating film 60 fully covers the conductive film 39 to its end portion, a portion of the first exposed portion 32c located to the right of the conductive film 39 in FIG. 5B is directly covered by the insulating film 60. In this modification, when the individual trace 41 is laid on top of the first exposed portion 32c, the portion of the first exposed portion 32c directly covered by the insulating film 60 has a minor portion that is out of contact with the conductive film 39 or the individual trace 41. Especially, when the lower electrode 32 is thin, electrical disconnection may occur in the portion of the first exposed portion 32c. However, in an illustrative embodiment shown in FIG. 5A, the end portion of the conductive film 39 is exposed from the insulating film 40. Therefore, reliability of electrical connection may increase as the individual trace 41 is laid over the second exposed portion 39a of the conductive film 39 and the first exposed portion 32c of the lower electrode 32.

The individual trace 41 extends from a position above the piezoelectric film 33 along the first exposed portion 32c of the lower electrode 32 to a region between the two pressure chamber rows 28. A drive contact 46 is formed at an end portion of the individual trace 41 opposite to the wide portion 32a with respect to the scanning direction. Between the two pressure chamber rows 28, the drive contact 46 of the individual trace 41 extending from the left piezoelectric element 31 and the drive contact 46 of the individual trace 41 extending from the right piezoelectric element 31, alternates along the feeding direction.

<Common Trace 42>

The common trace 42 includes a thin trace 43 and a thick trace 44, each disposed at a different layer. The thin trace 43 and the thick trace 44 are electrically connected to the upper electrodes 34.

As depicted in FIGS. 3 and 5, the thin trace 43 is disposed on an end portion of an upper surface of the piezoelectric body 37 in the scanning direction. The thin trace 43 extends along the feeding direction. End portions (e.g., a left end portion in FIG. 5A) of the upper electrodes 34 aligned along the feeding direction are electrically connected to each other by the thin trace 43. The thin trace 43 is formed of the same material as the upper electrodes 34 (e.g., iridium). The thin trace 43 is provided on the same layer as the upper electrode 34. As will be described later, the thin trace 43 may be formed at the same time as the process of patterning the upper electrodes 34.

The thick trace 44 is formed above the insulating film 40. As depicted in FIG. 2, the thick trace 44 encloses the upper electrodes 34 arranged along the feeding direction on an upper surface of the piezoelectric body 37. Edge portions (e.g., left end portions in FIG. 5A) of the upper electrodes 34 are electrically connected to each other by an end portion of the thick trace 44 in the scanning direction. Inner end portions (e.g., a right end portion in FIG. 5A) of the upper electrodes 34 in the scanning direction are electrically connected to each other by an inner portion of the thick trace 44 in the scanning direction. The thick trace 44 is formed of the same material as the individual traces 41 (e.g., gold). The thick trace 44 is thicker than the upper electrode 34, and has a thickness of for example, 1.0 μm. As the upper electrodes 34 are electrically connected by the thick trace 44, electric resistance of the common trace 42 may be reduced. This may reduce variances in the potentials of the upper electrodes 34.

The individual traces 41 and the thick trace 44 of the common trace 42 may be formed of material, e.g., aluminum, other than gold. When the traces 41 and 44 are formed of aluminum, the traces 41 and 44 may be preferably covered by a trace protective film formed of, for example, silicon nitride (SiN).

As depicted in FIGS. 2 and 3, the thin trace 43 and an end portion of the thick trace 44 in the scanning direction constitute a first connecting trace 45a configured to electrically connect end portions of the upper electrodes 34 in the scanning direction. An inner portion of the thick trace 44 in the scanning direction constitutes a second connecting trace 45b configured to electrically connect inner end portions of the upper electrodes 34 in the scanning direction.

The common trace 42 further includes overlapping portions that overlap end portions of the pressure chambers 26 in the scanning direction. More specifically, as depicted in FIGS. 3, 5A and 5B, a portion of the first connecting trace 45a disposed on an end side of the head unit 16 in the scanning direction overlaps an end portion of the pressure chamber 26 in the scanning direction. A portion of the second connecting trace 45b disposed on an inner side of the head unit 16 in the scanning direction overlaps an inner end portion of the pressure chamber 26 in the scanning direction. The overlapping portions, e.g., the first connecting traces 45a and the second connecting traces 45b, overlap end portions of the lower electrode 32 in the scanning direction. Thus, the common trace 42 overlaps end portions of the pressure chamber 26 in the scanning direction, so that the physical size of the head unit 16 in the scanning direction may be reduced.

The insulating film 40 is disposed between the overlapping portions, e.g., the first connecting traces 45a and the second connecting traces 45b, and the piezoelectric film 33. In other words, the insulating film 40 overlaps edge portions of the pressure chamber 26 in the scanning direction. Accordingly, a curvature radius of a deformed shape of the piezoelectric film 33 may become relatively great at a position corresponding to the edge portion of the pressure chamber 26. Accordingly, a crack in the piezoelectric film 33 may be prevented or reduced. Further, the insulating film 40 overlaps end portions of the lower electrode 32 in the scanning direction, so that a crack may further be prevented or reduced.

As depicted in FIG. 2, the common trace 42 includes two lead-out traces 48, each configured to electrically connect the second connecting traces 45b disposed on upper surfaces of the left and right piezoelectric bodies 37. Each of the lead-out traces 48 is disposed at a region between the two pressure chamber rows 28, in front of and behind the plurality of drive contacts 46, e.g., in front of a frontmost drive contact 46 and behind a rearmost drive contact 46. A central portion of each lead-out trace 48 in the scanning direction includes a ground contact 47 to which the COF 50 (described below) is bonded.

(COF)

As depicted in FIGS. 2-5B, one end portion of the COF 50 is bonded to a central portion of the channeled substrate 21 in the scanning direction where the drive contacts 46 and the two ground contacts 47 are disposed. The driver IC 51 is mounted to a portion of the COF 50. The other end portion of the COF 50 is connected to the controller 6 of the printer 1 (refer to FIG. 1). The COF 50 includes a plurality of input traces 53, a plurality of output traces 52, and a ground trace (not depicted). The input traces 53 and the output traces 52 are connected to the driver IC 51. The driver IC 51 is electrically connected to the controller 6 via the input traces 53. When the COF 50 is bonded to the channeled substrate 21, an end of each output trace 52 is electrically connected to a respective one of the drive contacts 46. The ground trace of the COF 50 is electrically connected to the ground contacts 47.

The driver IC 51 is configured to generate drive signals, based on control signals from the controller 6, and output the drive signals to the piezoelectric elements 31. The drive signals are input to the drive contacts 46 via the output traces 52, and supplied to the corresponding lower electrodes 32 via the individual traces 41. At this time, the potential of the lower electrode 32 changes between a predetermined drive potential and the ground potential. The ground potential is applied to the upper electrodes 34 connected to the ground contacts 47.

Operations of the piezoelectric element 31 when a drive signal is supplied from the driver IC 51 will be described. When a drive signal is not supplied, the potential of the lower electrode 32 is at the ground potential, which is the same potential as that of the upper electrode 34. As a drive signal is supplied to the lower electrode 32, an electric field parallel to the thickness direction of the active portion 36 of the piezoelectric film 33 is applied to the active portion 36, due to the potential difference between the lower electrode 32 and the upper electrode 34. At this time, the active portion 36 above the insulating film 30 deforms, and the piezoelectric element 31 as a whole convexly deforms toward the pressure chamber 26. Thus, the volumetric capacity of the pressure chamber 26 is reduced and a pressure wave is generated in the pressure chamber 26. Accordingly, an ink droplet is ejected from the nozzle 24 communicating with the pressure chamber 26.

(Cover Member)

The cover member 23 is provided to protect the piezoelectric elements 31. The cover member 23 is attached to an upper surface of the insulating film 30 with adhesive. As depicted in FIG. 5A, the cover member 23 includes an opening portion 23a and a cover portion 23b. The opening portion 23a is disposed at a central portion of the cover member 23 in the scanning direction. The cover portion 23b is disposed on each left and right side of the opening portion 23a. The COF 50 bonded to the drive contacts 46 and the two ground contacts 47 is inserted into the opening portion 23a. Each left and right cover portion 23b covers a corresponding one of the two piezoelectric bodies 37. The openings of the manifolds 25, each formed at a respective one of left and right end portions of the channeled substrate 21, are exposed from the cover member 23, to allow the ink supply member (not depicted) to be connected to the openings of the manifolds 25.

Figure 7A:
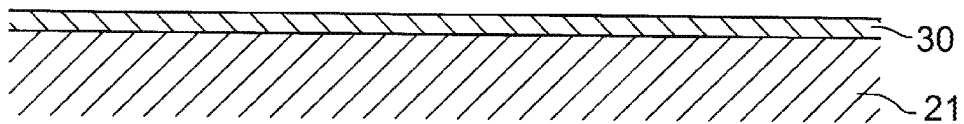
Figure 7B:
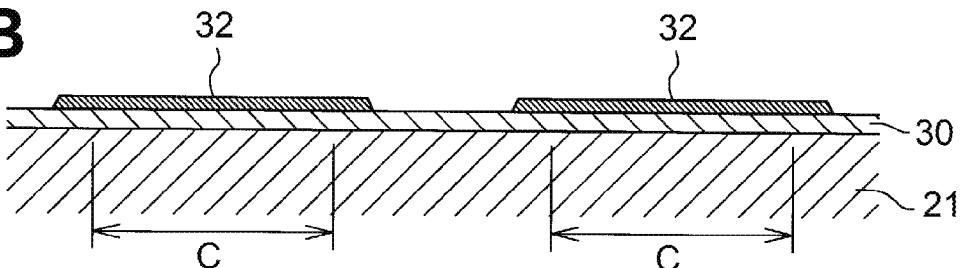
Figure 7C:
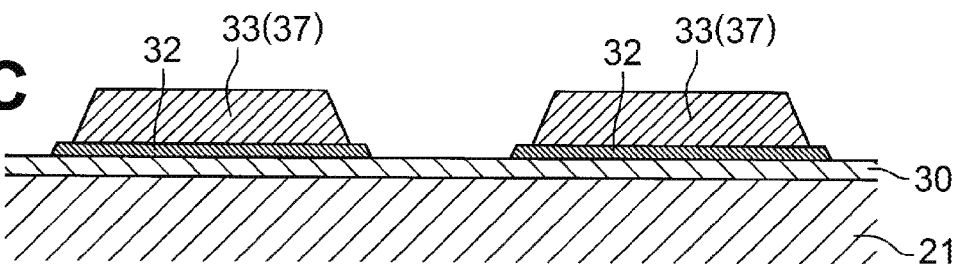
Figure 7D:
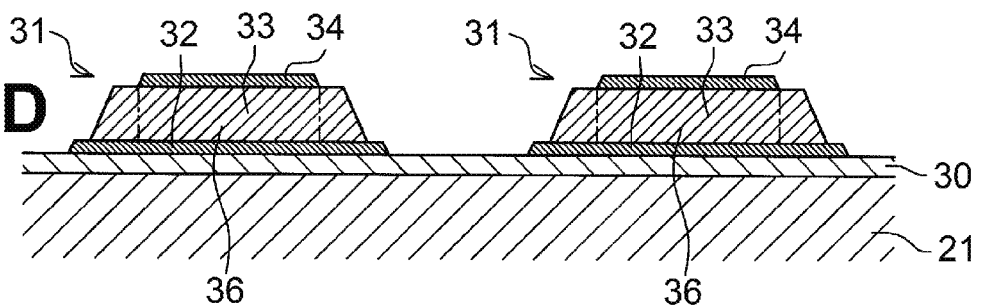
Figure 7E:
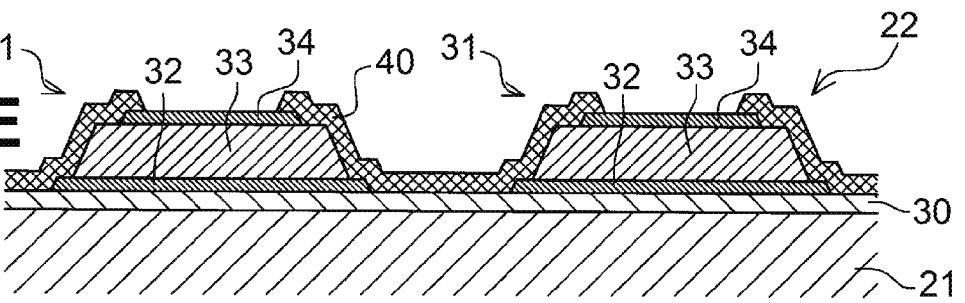

Next, manufacturing processes of the head unit 16 will be described. FIGS. 7A-7E depict manufacturing processes of the piezoelectric actuator 22. FIG. 7A depicts a process of forming the insulating film 30. FIG. 7B depicts a process of forming the lower electrodes 32. FIG. 7C depicts a process of forming the piezoelectric film 33. FIG. 7D depicts a process of forming the upper electrodes 34. FIG. 7E depicts process of forming the insulating film 40 for protecting the piezoelectric film 33.

First, as depicted in FIG. 7A, the insulating film 30 of silicon dioxide is formed on a surface of the silicon channeled substrate 21 by, for example, thermal oxidation.

Next, as depicted in FIG. 7B, a film of, for example, a platinum (Pt), is formed on the insulating film 30, for example, by sputtering, and is patterned to form the plurality of lower electrodes 32. At this time, the lower electrodes 32 are patterned such that, with respect to the feeding direction, each end of the lower electrode 32 is located further from a corresponding end of a pressure chamber formation region C of the channeled substrate 21 where the pressure chamber 26 is formed. In other words, the lower electrode 32 extends beyond each end of the region C with respect to the feeding direction.

Next, as depicted in FIG. 7C, the piezoelectric film 33 is formed, above the lower electrodes 32, of piezoelectric material, e.g., PZT, entirely on the upper surface of the insulating film 30, for example, by a sol-gel method or a spattering method. The piezoelectric film 33 is patterned by etching to form the piezoelectric bodies 37.

With respect to the feeding direction, each end of the lower electrode 32 is located further from a corresponding one of the two side surfaces 33b of the piezoelectric film 33. In other words, an entire portion of the piezoelectric film 33 is disposed above the lower electrode 32 with respect to the feeding direction. Therefore, with respect to the feeding direction, the piezoelectric film 33 may be formed on the same planar condition. Accordingly, the crystal orientation direction of the piezoelectric material constituting the piezoelectric film 33 may be uniform with respect to the feeding direction, and discontinuous crystallinity may not occur.

The lower electrode 32 is formed above the insulating film 30 and extends beyond each end of the pressure chamber forming region C of the channeled substrate 21 with respect to the feeding direction. When the piezoelectric film 33 is patterned as described above, reduction in the thickness of a portion of the insulating film 30 covering the pressure chambers 26 may be prevented or reduced by the lower electrode 32.

Next, as depicted in FIG. 7D, a film of, for example, iridium (Ir), is formed on an upper surface of the piezoelectric film 33, for example, by a sputtering method. The iridium film is patterned to form the plurality of upper electrodes 34. At this time, each upper electrode 34 is formed such that right and left ends of the upper electrode 34 in FIG. 7D is located closer to the center of a corresponding pressure chamber 26 with respect to the feeding direction than right and left ends of a corresponding lower electrode 32 in FIG. 7D, respectively. In other words, each end of the upper electrodes 32 with respect to the feeding direction is located closer to the center of the pressure chamber 26 with respect to the feeding direction than a corresponding end of the lower electrode 32. Thus, a position of each end of the active portion 36 with respect to the feeding direction is determined by the position of the upper electrode 34 with respect to the feeding direction. As described above, crystal orientation of the piezoelectric film 33 disposed above the lower electrode 32 may be uniform. Therefore, end portions of the active portion 36 may not have discontinuous crystallinity.

When the upper electrodes 34 are patterned as described above, the conductive film 39 (refer to FIG. 5A), which covers the upper surface of the piezoelectric film 33 to the first exposed portion 32c of the lower electrode 32 via the side surface 33a, is left, so that the first exposed portion 32c may be prevented or reduced from being etched. The thin trace 43 of the common trace 42 (refer to FIGS. 3, 5A and 5B) configured to electrically connect the upper electrodes 34 is formed at the same time when the upper electrodes 34 are patterned.

Next, as depicted in FIG. 7E, the insulating film 40 is formed on the upper electrodes 34, and is patterned. Although not depicted in FIG. 7E, the individual traces 41, and the thick trace 44 of the common trace 42 (refer to FIG. 5A) are formed of, for example, gold (Au), on the insulating film 40.

Figure 8A:
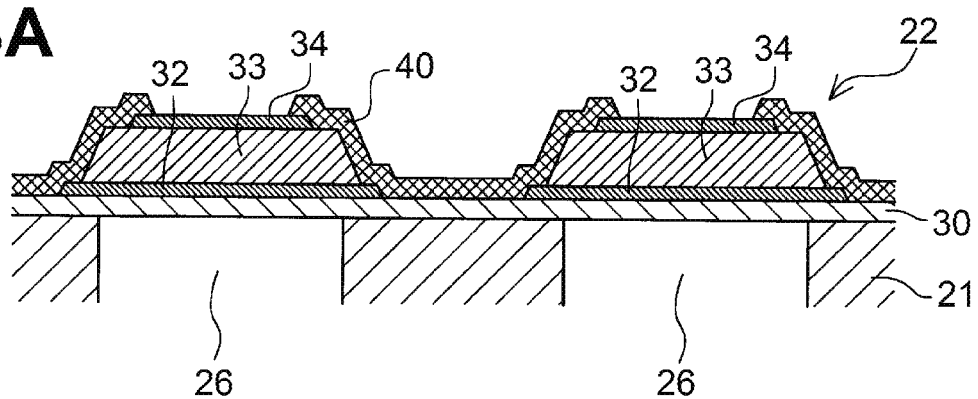
Figure 8B:
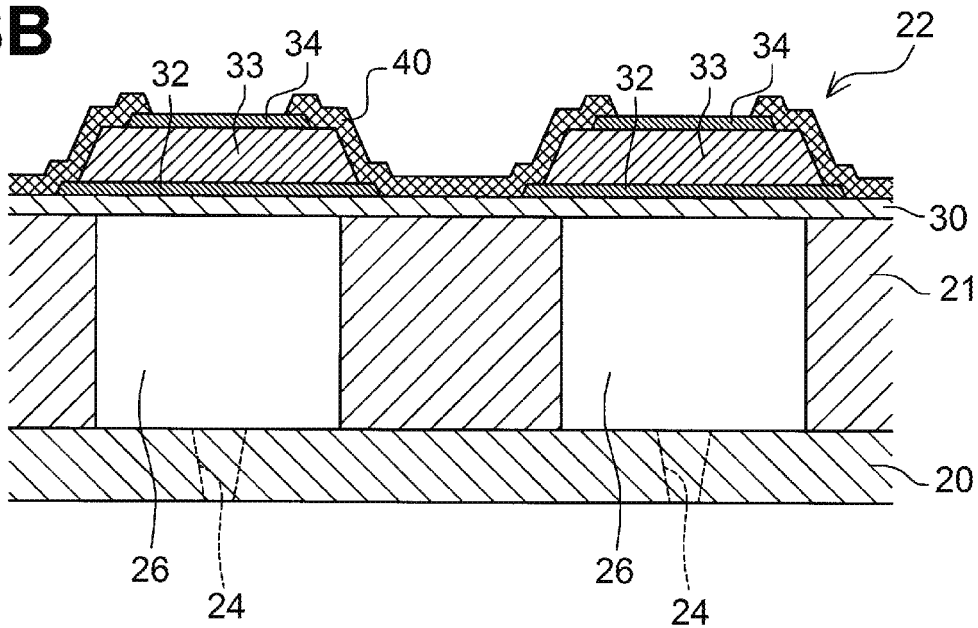

FIG. 8A depicts a process of forming the pressure chambers 26. FIG. 8B depicts a process of bonding the nozzle plate 20. After the piezoelectric actuator 22 is formed, the cover member 23 (refer to FIG. 5A) is bonded to the channeled substrate 21. Thereafter, the channeled substrate 21 is subjected to a polishing process. Thereafter, as depicted in FIG. 8A, etching is performed from a lower surface of the channeled substrate 21 opposite to the piezoelectric actuator 22, to form a plurality of the pressure chambers 26 on the channeled substrate 21. Further, as depicted in FIG. 8B, the nozzle plate 20 is bonded to the lower surface of the channeled substrate 21 opposite to the piezoelectric actuator 22.

In the above-described illustrative embodiment, the longitudinal direction of the pressure chamber 26. e.g., the scanning direction, corresponds to "a longitudinal direction" in the disclosure. The transverse direction e.g., the feeding direction, corresponds to "a transverse direction" in the disclosure. The head unit 16 corresponds to "a liquid ejection apparatus" in the disclosure. The wide portion 32a corresponds to "a partial overlapping portion" in the disclosure. The insulating film 30 corresponds to "a first insulating film" in the disclosure. The insulating film 40 corresponds to "a second insulating film" in the disclosure. The thick trace 44 corresponds to "a first conductive layer" in the disclosure. The thin trace 43 corresponds to "a second conductive layer" in the disclosure.

Next, modifications of the above-described illustrative embodiment will be described. Like reference numerals denote like corresponding parts and detailed description thereof with respect to the following modifications will be omitted herein.

1] The following modification may be made as long as, with respect to the feeding direction, each end of the upper electrode 34 is located closer to the center of the pressure chamber 26 than a corresponding end of the lower electrode 32.

Figure 9A:
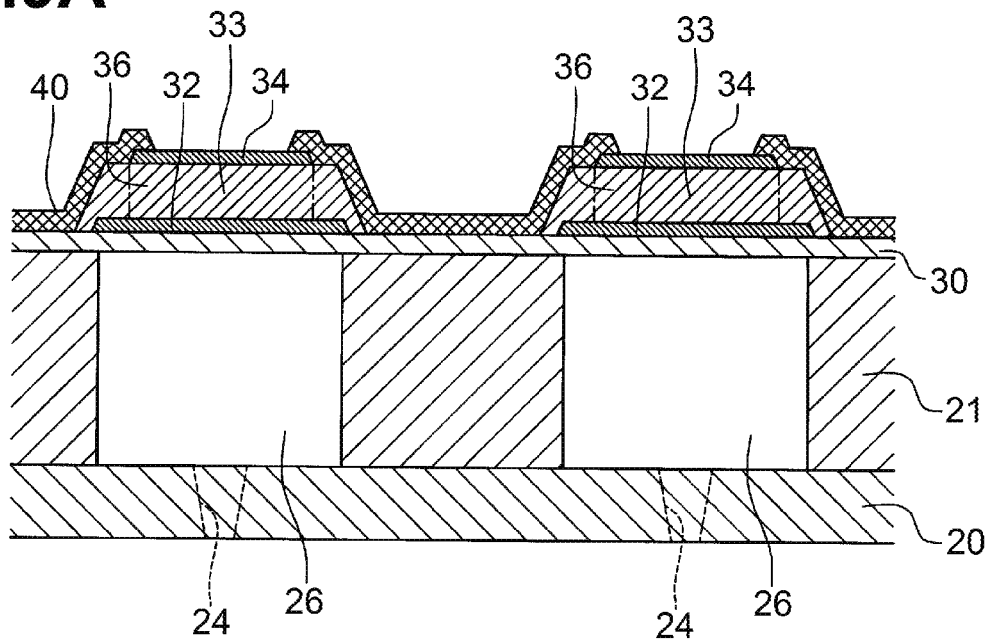
FIGS. 9A and 9B are cross-sectional views of a head unit according to a modification of the illustrative embodiment, wherein FIGS. 9A and 9B correspond to FIG. 6.

For example, as depicted in FIG. 9A, with respect to the feeding direction, each end of the lower electrode 32 may be located closer to the center of the pressure chamber 26 than a corresponding end of the piezoelectric film 33. Alternatively, as depicted in FIG. 9B, with respect to the feeding direction, each end of the lower electrode 32 may be located closer to the center of the pressure chamber 26 than a corresponding end of the pressure chamber 26.

Figure 9B:
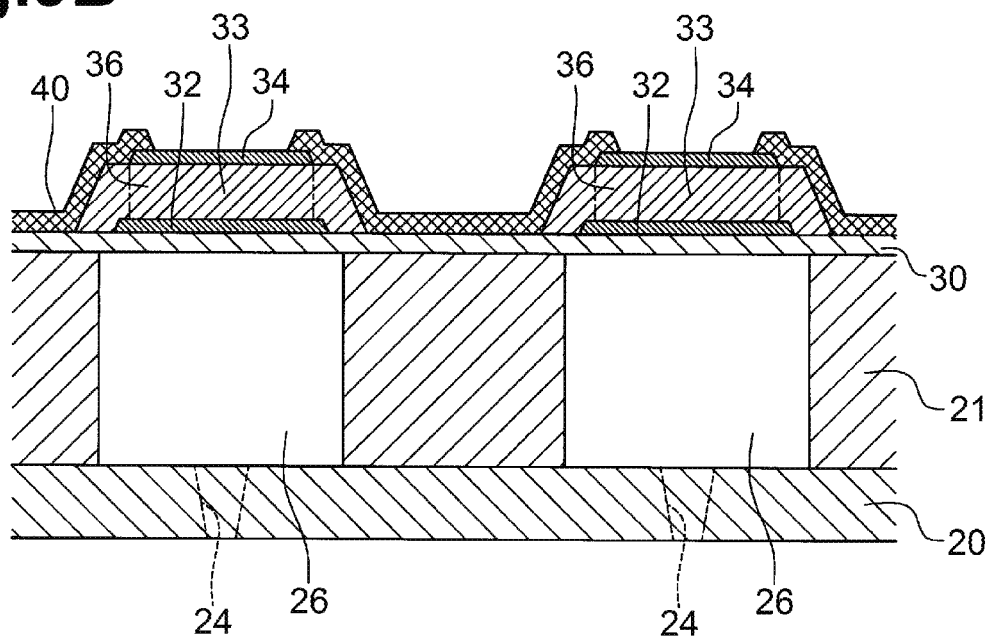

In the structures of FIGS. 9A and 9B, each end of the lower electrode 32 is closer to the center of the pressure chamber 26 than a corresponding end of the piezoelectric film 33 with respect to the feeding direction. This may cause discontinuous crystallinity at a position between a particular portion of the piezoelectric film 33 above the lower electrode 32 and another portion further from an end of the particular portion with respect to the feeding direction. However, each end of the upper electrode 34 is located closer to the center of the pressure chamber 26 than a corresponding end of the lower electrode 32 with respect to the feeding direction. Therefore, with respect to the feeding direction, positions of ends of the active portion 36 are determined by positions of the ends of the upper electrode 34. The ends of the lower electrode 32 are irrelevant to define the active portion. In other words, even when the piezoelectric film 33 has a discontinuous portion with respect to crystallinity, at the end of the lower electrode 32, the discontinuous portion may not at an end portion of the active portion 36. Accordingly, occurrence of a crack in the piezoelectric film 33 when the active portion 36 deforms may be prevented or reduced.

Figure 10:
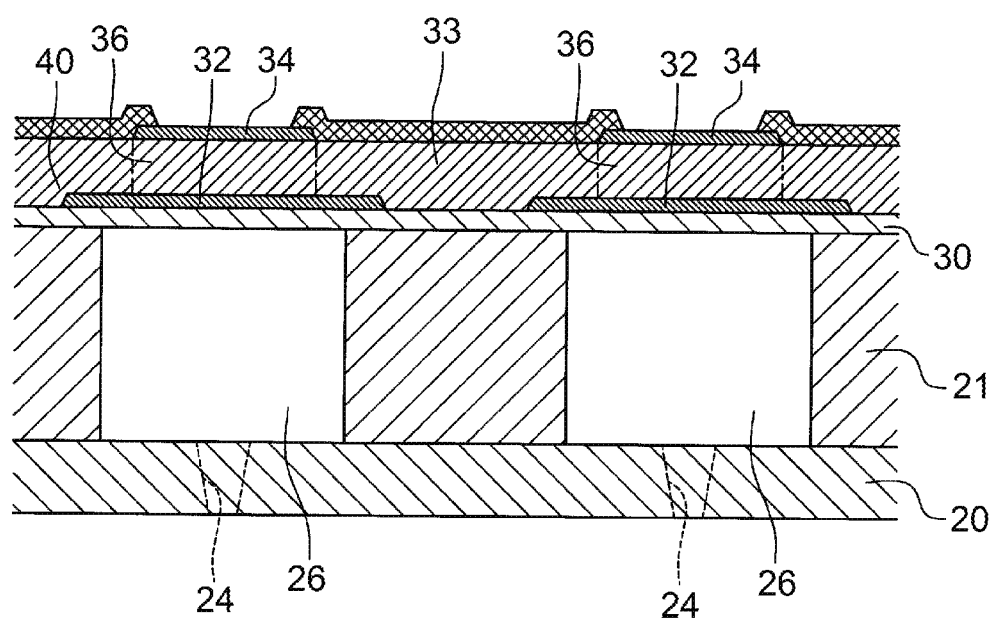
FIG. 10 is a cross-sectional view of a head unit according to another modification of the illustrative embodiment, wherein FIG. 10 corresponds to FIG. 6.

2] In the illustrative embodiment, as depicted in FIG. 6, the slit 38 is provided at a position between the two pressure chambers 26 adjacent along the feeding direction. In another embodiment, the slit 38 may not necessarily provided and the piezoelectric film 33 may continue between adjacent pressure chambers 26 with respect to the feeding direction, as depicted in FIG. 10.

3] In the illustrative embodiment, the conductive film 39 is provided at the side surface 33a of the piezoelectric film 33 through which the lower electrode 32 is exposed. In another embodiment, the conductive film 39 may be omitted.

4] A position where the insulating film 40 is formed for covering the piezoelectric film 33, may be changed as necessary. For example, in the illustrative embodiment, the insulating film 40 overlaps, with respect to the scanning direction, an edge portion of the pressure chamber 26 and the active portion 36, as depicted in FIG. 5A. In another embodiment, the insulating film 40 may not necessarily overlap the active portion 36. The insulating film 40 may be formed on the piezoelectric film 33 at a position further from an edge of the pressure chamber 26 with respect to the scanning direction, without overlapping the edge portion of the pressure chamber 26.

Figure 11:
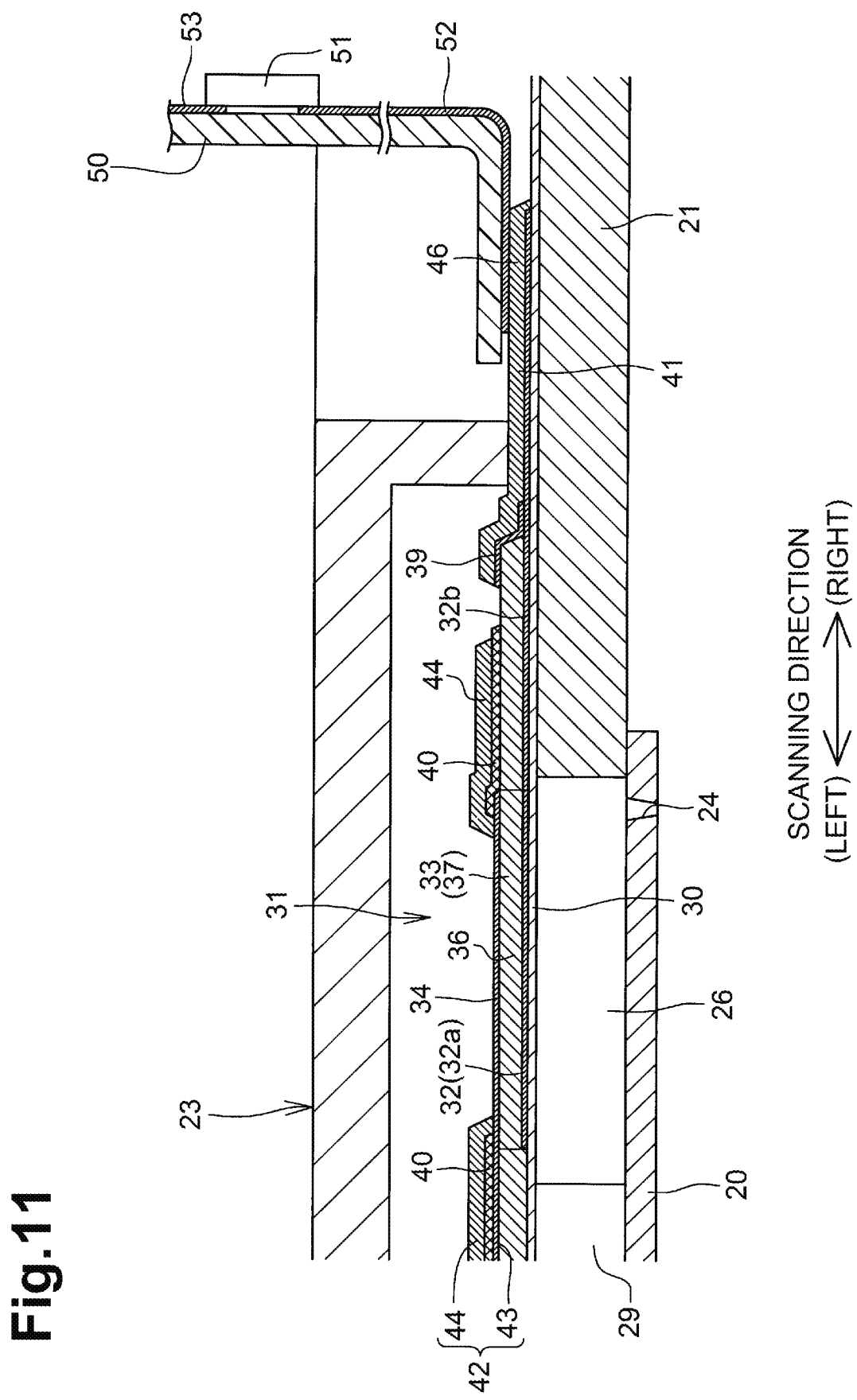
FIG. 11 is a cross-sectional view of a head unit according to yet another modification of the illustrative embodiment, wherein FIG. 11 corresponds to FIG. 5A.
Figure 12:
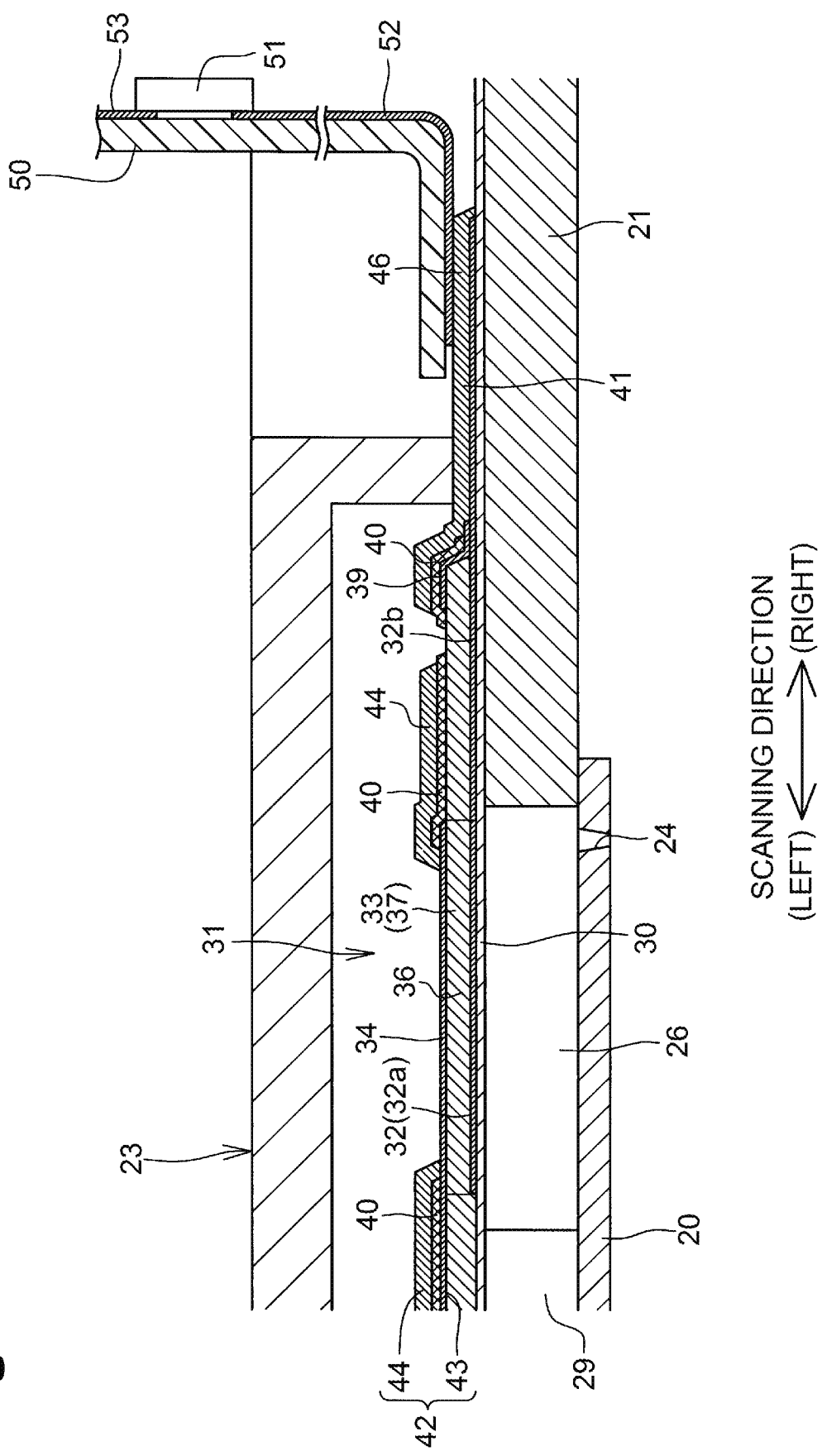
FIG. 12 is a cross-sectional view of a head unit according to still another modification of the illustrative embodiment, wherein FIG. 12 corresponds to FIG. 5A.

As depicted in FIG. 11, a right end portion of the insulating film 40 may not necessarily cover the conductive film 39. Alternatively, as depicted in FIG. 12, a portion of the insulating film 40 between the conductive film 39 and the thick trace 44 may be removed, after the insulating film 40 covers the conductive film 39.

5] The structure of the common trace 42 may be changed as necessary. For example, as depicted in FIG. 13, a left portion of the thick trace 44 may contact the plurality of upper electrodes 34 (only one of which is depicted in FIG. 13) or the thin trace 43 at a region further from edges of the pressure chambers 26 (only one of which is depicted in FIG. 13) with respect to the scanning direction. The common trace 42 may not necessarily include two types of traces 43 and 44, each provided at a different layer, but may include one type of the traces 43 and 44. The common trace 42 may not necessarily overlap end portions of the plurality of pressure chambers 26 in the scanning direction. The common trace 42 may not necessarily overlap the pressure chambers 26.

In the illustrative embodiment and its modifications, the disclosure is applied to an inkjet head configured to eject ink on a recording sheet to print, for example, an image. The disclosure may be applied to a liquid ejection apparatus to be used in various applications other than an image printing. For example, the disclosure may be applied to a liquid ejection apparatus configured to eject conductive liquid on a substrate to form conductive patterns on a surface of the substrate.

What is claimed is:

1. A liquid jetting head comprising:
pressure chambers arranged along an arrangement direction;
an insulating film covering the pressure chambers;
piezoelectric elements corresponding to the pressure chambers, respectively, each piezoelectric element comprising a lower electrode disposed above the insulating film, a piezoelectric film disposed above the lower electrode and an upper electrode disposed above the piezoelectric film; and
a common trace connecting to the upper electrode and another upper electrode, the upper electrode and the another upper electrode are disposed side by side in the arrangement direction;
wherein the lower electrode has a wide portion and a narrow portion narrower than the wide portion in the arrangement direction, the wide portion at least partially overlaps the corresponding pressure chamber in an orthogonal direction, the orthogonal direction is orthogonal to the arrangement direction, and the wide portion has two ends in the arrangement direction,
a distance from the center of the corresponding pressure chamber in the arrangement direction to one of the two ends of the pressure chamber in the arrangement direction is smaller than a distance from the center of the same pressure chamber in the arrangement direction to a corresponding one of the two ends of the wide portion in the arrangement direction.

2. The liquid jetting head according to claim 1,
wherein the upper electrode has two ends in the arrangement direction, a distance from the center of the corresponding pressure chamber in the arrangement direction to one of the two ends of the upper electrode in the arrangement direction is smaller than a distance from the center of the same pressure chamber in the arrangement direction to the corresponding one of the two ends of the pressure chamber in the arrangement direction.

3. The liquid jetting head according to claim 1,
wherein the piezoelectric film has two ends in the arrangement direction, the upper electrode has two ends in the arrangement direction, a distance from the center of the corresponding pressure chamber in the arrangement direction to one of the two ends of the upper electrode in the arrangement direction is smaller than a distance from the center of the same pressure chamber in the arrangement direction to a corresponding one of the two ends of the piezoelectric film in the arrangement direction.

4. The liquid jetting head according to claim 1,
wherein the piezoelectric film has two ends in the arrangement direction, a distance from the center of the corresponding pressure chamber in the arrangement direction to one of the two ends of the corresponding piezoelectric film in the arrangement direction is smaller than a distance from the center of the same pressure chamber in the arrangement direction to a corresponding one of the two ends of the wide portion in the arrangement direction.

5. A printer comprising:
a feeding mechanism configured to feed a recording sheet in a feeding direction; and
a liquid jetting head comprising:
pressure chambers arranged along the feeding direction;
an insulating film covering the pressure chambers;
piezoelectric elements corresponding to the pressure chambers, respectively, each piezoelectric element comprising a lower electrode disposed above the insulating film, a piezoelectric film disposed above the lower electrode and an upper electrode disposed above the piezoelectric film; and
a common trace connecting to the upper electrode and another upper electrode, the upper electrode and the another upper electrode are disposed side by side in the feeding direction;
wherein the lower electrode has a wide portion and a narrow portion narrower than the wide portion in the feeding direction, the wide portion at least partially overlaps the corresponding pressure chamber in an orthogonal direction, the orthogonal direction is orthogonal to the feeding direction, and the wide portion has two ends in the feeding direction,
a distance from the center of the corresponding pressure chamber in the feeding direction to one of the two ends of the pressure chamber in the feeding direction is smaller than a distance from the center of the same pressure chamber in the feeding direction to a corresponding one of the two ends of the wide portion in the feeding direction.

6. The printer according to claim 5,
wherein the upper electrode has two ends in the feeding direction, a distance from the center of the corresponding pressure chamber in the feeding direction to one of the two ends of the upper electrode in the feeding direction is smaller than a distance from the center of the same pressure chamber in the feeding direction to the corresponding one of the two ends of the pressure chamber in the feeding direction.

7. The printer according to claim 5,
wherein the piezoelectric film has two ends in the feeding direction, the upper electrode has two ends in the feeding direction, a distance from the center of the corresponding pressure chamber in the feeding direction to one of the two ends of the upper electrode in the feeding direction is smaller than a distance from the center of the same pressure chamber in the feeding direction to a corresponding one of the two ends of the piezoelectric film in the feeding direction.

8. The printer according to claim 5,
wherein the piezoelectric film has two ends in the feeding direction, a distance from the center of the corresponding pressure chamber in the feeding direction to one of the two ends of the corresponding piezoelectric film in the feeding direction is smaller than a distance from the center of the same pressure chamber in the feeding direction to a corresponding one of the two ends of the wide portion in the feeding direction.

* * * * *